US012575178B2

(12) United States Patent
Wang et al.

(10) Patent No.: US 12,575,178 B2
(45) Date of Patent: Mar. 10, 2026

(54) FRONT END INTEGRATED CIRCUITS INCORPORATING DIFFERING SILICON-ON-INSULATOR TECHNOLOGIES

(71) Applicant: SKYWORKS SOLUTIONS, INC., Irvine, CA (US)

(72) Inventors: Hailing Wang, Acton, MA (US); Guillaume Alexandre Blin, Carlisle, MA (US); David Scott Whitefield, Andover, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 303 days.

(21) Appl. No.: 17/524,198

(22) Filed: Nov. 11, 2021

(65) Prior Publication Data
US 2022/0254812 A1 Aug. 11, 2022

Related U.S. Application Data

(60) Provisional application No. 63/112,951, filed on Nov. 12, 2020.

(51) Int. Cl.
| | |
|---|---|
| *H01L 27/12* | (2006.01) |
| *H01L 21/84* | (2006.01) |
| *H01L 29/78* | (2006.01) |
| *H03F 3/213* | (2006.01) |

(52) U.S. Cl.
CPC .......... *H01L 27/1203* (2013.01); *H01L 21/84* (2013.01); *H01L 29/7838* (2013.01); *H03F 3/213* (2013.01); *H03F 2200/294* (2013.01)

(58) Field of Classification Search
CPC . H01L 27/1203; H01L 29/7838; H01L 24/84; H01L 27/1207; H01L 21/84; F03F 3/213; H03F 2200/294; H03F 3/213
USPC ........................................................ 257/348
See application file for complete search history.

(56) References Cited

U.S. PATENT DOCUMENTS

| | | | | |
|---|---|---|---|---|
| 7,847,353 B2 * | 12/2010 | Hill | ........................ | G02B 6/136 257/350 |
| 9,960,115 B1 * | 5/2018 | Toh | ..................... | H01L 21/7684 |
| 10,062,712 B1 * | 8/2018 | Moen | ................ | H01L 21/31053 |
| 2003/0227041 A1 * | 12/2003 | Atwood | .............. | H01L 27/1203 257/908 |
| 2006/0216898 A1 * | 9/2006 | Tigelaar | .............. | H01L 27/1203 438/295 |
| 2012/0228711 A1 * | 9/2012 | Hoshino | ................ | H01L 29/78 257/E21.409 |

(Continued)

FOREIGN PATENT DOCUMENTS

CN 113745335 A * 12/2021 ....... H01L 21/28158

*Primary Examiner* — Mohammed Shamsuzzaman
(74) *Attorney, Agent, or Firm* — Chang & Hale LLP

(57) ABSTRACT

SOI-based technology platforms are described that provide fully integrated front end integrated circuits (FEICs) that include switches, low-noise amplifiers (LNAs), and power amplifiers (PAs). The PAs can be built in a thick film region of the integrated circuit, resulting in a partially depleted silicon-on-insulator (PDSOI) PA, and the switches and LNAs can be built in a thin film region of the integrated circuit, resulting in fully depleted silicon-on-insulator (FD-SOI) switches and LNAs. The resulting fully integrated FEIC includes PDSOI PAs with FDSOI switches and LNAs. Passive components can be built in the thick film region, the thin film region, or both regions.

6 Claims, 22 Drawing Sheets

(56)　　　　　　　References Cited

U.S. PATENT DOCUMENTS

| | | | |
|---|---|---|---|
| 2019/0057981 A1* | 2/2019 | Fagot | .................. H01L 27/1203 |
| 2019/0326183 A1 | 10/2019 | Costaganna et al. | |
| 2020/0020721 A1* | 1/2020 | Nowak et al. | ...... H01L 21/1207 |

* cited by examiner

Build integrated FEM with PDSOI PA and FDSOI LNA and switch

700

705 — Prepare substrate with buried oxide layer and thick film silicon

710 — Build PDSOI PA device in thick film region

715 — Decrease thickness of a portion of thick film region to create thin film region 720 — Build FDSOI LNA and switch devices in thin film region 725 — Build passive devices in one or both regions 755 — Prepare substrate with buried oxide layer and thick film silicon 760 — Decrease thickness of a portion of thick film region to create thin film region 765 — Build PDSOI PA device in thick film region 770 — Build FDSOI LNA and switch devices in thin film region 775 — Build passive devices in one or both regions Build integrated FEM with PDSOI PA and FDSOI LNA and switch

750

FRONT END INTEGRATED CIRCUITS INCORPORATING DIFFERING SILICON-ON-INSULATOR TECHNOLOGIES

CROSS-REFERENCE TO RELATED APPLICATIONS

This application claims priority to U.S. Prov. App. No. 63/112,951 filed Nov. 12, 2020 and entitled "FRONT END INTEGRATED CIRCUITS INCORPORATING DIFFER-ING SILICON-ON-INSULATOR TECHNOLOGIES," which is expressly incorporated by reference herein in its entirety.

BACKGROUND

Field

The present disclosure generally relates to front end integrated circuits for radio frequency applications.

Description of Related Art

Front end modules (FEMs) are built-in modules inte-grated with various functional components used in wireless front end circuits of wireless devices. Front end modules can be configured to process radio-frequency (RF) signals con-forming to various wireless protocols such as broadband cellular network technologies (e.g., 3G, 4G, 5G, Long Term Evolution (LTE), etc.), wireless networking technologies (e.g., Wi-Fi), short-range wireless technologies (e.g., BLU-ETOOTH®), and global positioning system (GPS) tech-nologies. Front end modules typically include circuitry and electrical components between the antenna and a digital baseband system sufficient to receive and transmit radio-frequency signals. Certain FEMs can include all the filters, low-noise amplifiers (LNAs), and down-conversion mixer (s) needed to process the modulated signals received at the antenna into signals suitable for input into a baseband analog-to-digital converter (ADC). FEMs may also include power amplifiers (PAs) and other circuitry of a transmitter for processing signals for transmission over the antenna. FEMs can be surface mount technology (SMT) modules, multi-chip modules (MCMs), or the like. FEMs can include PA blocks, LNA blocks, input and output matching, MIPI standard digital control blocks, filters, duplexers, multiplex-ers, antenna switches, band-select switches, and the like. A front end integrated circuit (FEIC) is a single semiconductor die that includes the functionality of a FEM.

SUMMARY

According to a number of implementations, the present disclosure relates to a front end integrated circuit that includes a substrate; an insulator layer on top of the sub-strate; and a semiconductor layer on top of the insulator layer, the semiconductor layer forming a thin film region and a thick film region, the thin film region including one or more fully depleted silicon-on-insulator (FDSOI) low noise amplifier (LNA) devices and one or more FDSOI switch devices, the thick film region including one or more partially depleted silicon-on-insulator (PDSOI) power amplifier (PA) devices.

In some embodiments, the insulator layer is at least 100 nm thick. In some embodiments, the semiconductor layer in the thin film region is at least 5 nm thick and less than or equal to 50 nm thick. In some further embodiments, the semiconductor layer in the thick film region is at least about 50 nm thick and less than or equal to 180 nm thick.

In some embodiments, the insulator layer is a buried oxide layer. In some embodiments, the semiconductor layer in the thin film region is ¼ of a gate length of the one or more FDSOI LNA devices. In some embodiments, the front end integrated circuit further includes one or more passive devices built in the thin film region of the semiconductor layer. In some embodiments, the front end integrated circuit further includes one or more passive devices built in the thick film region of the semiconductor layer.

In some embodiments, the thin film region of the semi-conductor layer is formed using local thinning. In some embodiments, the thick film region of the semiconductor layer is formed using selective epitaxial growth.

According to a number of implementations, the present disclosure relates to a method for manufacturing a front end integrated circuit. The method includes forming an insulator layer on top of a substrate. The method also includes forming a semiconductor layer on top of the insulator layer. The method also includes building a fully depleted silicon-on-insulator (FDSOI) low noise amplifier (LNA) device in the semiconductor layer. The method also includes building a FDSOI switch device in the semiconductor layer. The method also includes increasing a thickness of a portion of the semiconductor layer to form a thick film region of the semiconductor layer. The method also includes building a partially depleted silicon-on-insulator (PDSOI) power amplifier (PA) device in the thick film region of the semi-conductor layer, such that the FDSOI LNA device and the FDSOI switch device are in a thin film region of the semiconductor layer and the PDSOI PA device is in the thick film region.

In some embodiments, the insulator layer is at least about 100 nm thick. In some embodiments, the thin film region of the semiconductor layer is at least about 5 nm thick and less than or equal to about 50 nm thick. In some further embodi-ments, the thick film region of the semiconductor layer is at least about 50 nm thick and less than or equal to 180 nm thick.

In some embodiments, the thin film region of the semi-conductor layer is ¼ of a gate length of the FDSOI LNA device. In some embodiments, the method further includes building one or more passive devices in the thin film region of the semiconductor layer. In some embodiments, the method further includes building one or more passive devices in the thick film region of the semiconductor layer. In some embodiments, increasing the thickness comprises using selective epitaxial growth.

According to a number of implementations, the present disclosure relates to a method for manufacturing a front end integrated circuit. The method includes forming an insulator layer on top of a substrate. The method also includes forming a semiconductor layer on top of the insulator layer. The method also includes building a partially depleted silicon-on-insulator (PDSOI) power amplifier (PA) device in the semiconductor layer. The method also includes decreas-ing a thickness of a portion of the semiconductor layer to form a thin film region of the semiconductor layer. The method also includes building a fully depleted silicon-on-insulator (FDSOI) low noise amplifier (LNA) device in the thin film region of the semiconductor layer. The method also includes building a FDSOI switch device in the thin film region of the semiconductor layer, such that the PDSOI PA device is in a thick film region of the semiconductor layer and the FDSOI LNA device and the FDSOI switch device are in the thin film region of the semiconductor layer.

3

In some embodiments, the insulator layer is at least about 100 nm thick. In some embodiments, the thin film region of the semiconductor layer is at least about 5 nm thick and less than or equal to about 50 nm thick. In some further embodiments, the thick film region of the semiconductor layer is at least about 50 nm thick and less than or equal to 180 nm thick.

In some embodiments, the thin film region of the semiconductor layer is ¼ of a gate length of the FDSOI LNA device. In some embodiments, the method further includes building one or more passive devices in the thin film region of the semiconductor layer. In some embodiments, the method further includes building one or more passive devices in the thick film region of the semiconductor layer. In some embodiments, decreasing the thickness comprises using local thinning.

According to a number of implementations, the present disclosure relates to a method for manufacturing a front end integrated circuit. The method includes forming an insulator layer on top of a substrate. The method also includes forming a semiconductor layer on top of the insulator layer with a first thickness. The method also includes increasing a thickness of a portion of the semiconductor layer to form a thick film region of the semiconductor layer with another portion of the semiconductor layer with the first thickness being a thin film region. The method also includes building high voltage analog circuitry in the thick film region. The method also includes building low voltage analog circuitry in the thin film region.

In some embodiments, the insulator layer is at least about 100 nm thick. In some embodiments, the thin film region of the semiconductor layer is at least about 5 nm thick and less than or equal to about 50 nm thick. In some further embodiments, the thick film region of the semiconductor layer is at least about 50 nm thick and less than or equal to 180 nm thick.

In some embodiments, the high voltage analog circuitry includes a low dropout regulator. In some embodiments, the high voltage analog circuitry includes a high voltage power amplifier. In some embodiments, the method further includes building digital circuitry in the thin film region.

According to a number of implementations, the present disclosure relates to a method for manufacturing a front end integrated circuit. The method includes forming an insulator layer on top of a substrate. The method also includes forming a semiconductor layer on top of the insulator layer with a first thickness. The method also includes decreasing a thickness of a portion of the semiconductor layer to form a thin film region of the semiconductor layer with another portion of the semiconductor layer with the first thickness being a thick film region. The method also includes building a radio frequency (RF) device in the thick film region. The method also includes building analog or digital circuitry in the thin film region.

In some embodiments, the insulator layer is at least about 100 nm thick. In some embodiments, the thin film region of the semiconductor layer is at least about 5 nm thick and less than or equal to about 50 nm thick. In some further embodiments, the thick film region of the semiconductor layer is at least about 50 nm thick and less than or equal to 180 nm thick.

In some embodiments, the RF device in the thick film region includes a power amplifier (PA) device. In some further embodiments, the PA device comprises a partially depleted silicon-on-insulator (PDSOI) PA device.

In some embodiments, the digital circuitry includes logic gates.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

BRIEF DESCRIPTION OF THE DRAWINGS

FIG. 1B illustrates another fully integrated FEIC fabricated using SOI processing technologies.

FIGS. 2A, 2B, 2C, and 2D illustrate an example FEIC at different stages in a manufacturing process.

FIGS. 3A, 3B, 3C, and 3D illustrate a variation on the process for building the FEIC described with respect to FIGS. 2A-2D.

FIGS. 5A, 5B, 5C, and 5D illustrate a variation on the process for building the FEIC described with respect to FIGS. 4A-4D.

DETAILED DESCRIPTION OF SOME EMBODIMENTS

Figure 1A:
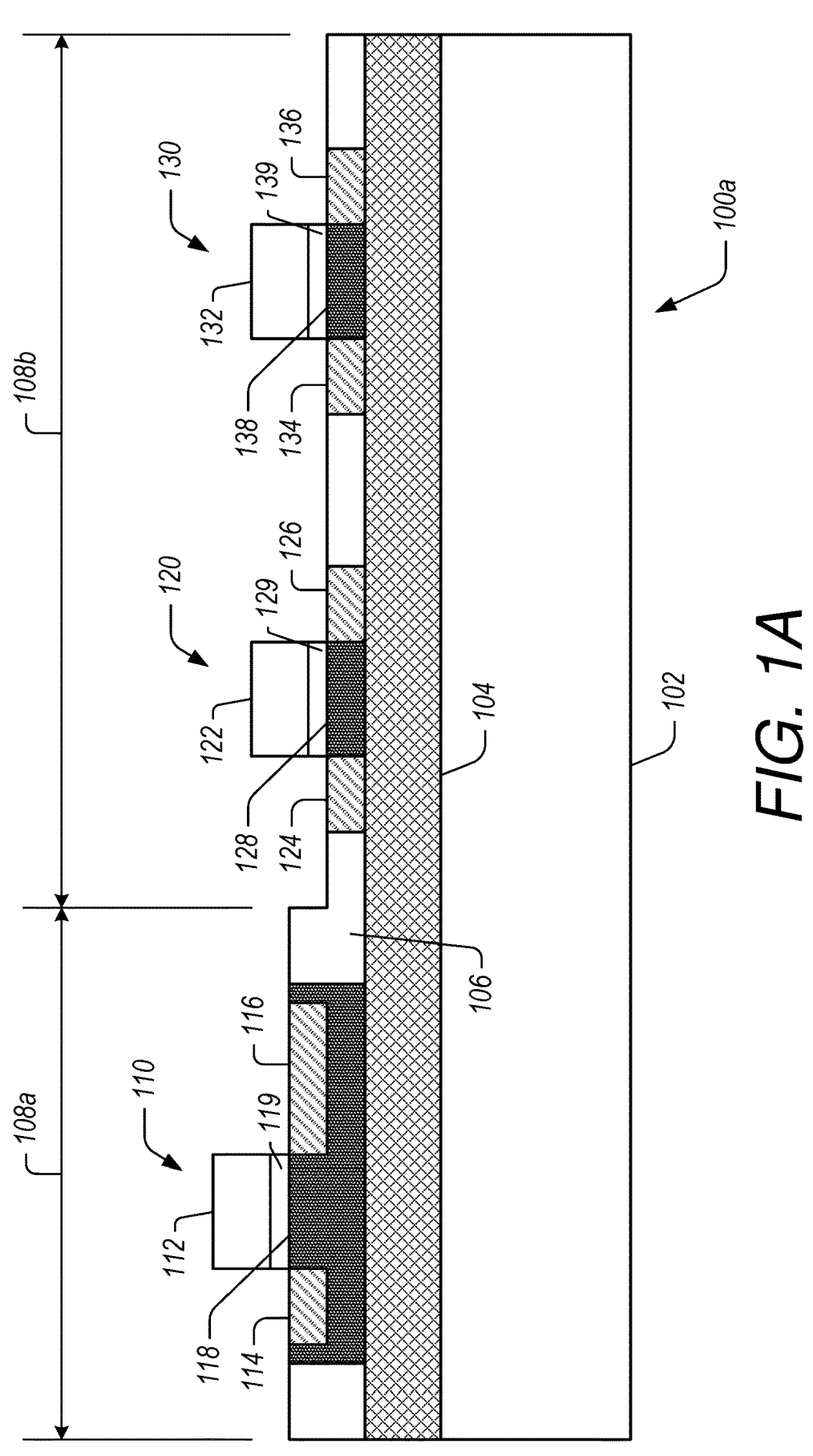
FIG. 1A illustrates a fully integrated front end integrated circuit (FEIC) fabricated using silicon-on-insulator (SOI) processing technologies.

The headings provided herein, if any, are for convenience only and do not necessarily affect the scope or meaning of the claimed subject matter.

Overview

A front end integrated circuit (FEIC) is a single semiconductor die that includes the functionality of a front end module (FEM). It would be desirable to develop a technology platform for an FEIC to satisfy the ever-increasing demand for higher performance, smaller sizes, and lower costs. Typically, analog circuitry drives the performance of chips used in FEICs, the analog circuitry including elements such as low noise amplifiers (LNAs), switches, power amplifiers (PAs), passive devices, analog circuitry (e.g., level shifters, summing devices, current mirrors, etc.), digital circuitry (e.g., logic gates), regulators (e.g., low dropout regulators), charge pumps, and the like. A fully integrated radio frequency (RF) FEIC, as the term is used herein, incorporates elements for both transmission and receiving in a single die. These elements include PAs, LNAs, and switches and may include suitable passive devices, analog and digital circuitry, regulators, and the like.

Promising avenues for creating fully integrated RF FEICs include silicon-on-insulator (SOI) process technologies. SOI is the fabrication of silicon semiconductor devices in a layered silicon-insulator-silicon substrate, to reduce parasitic capacitance within the device, thereby improving performance. SOI process technologies may enable improved characteristics for RF FEICs (e.g., high-bandwidth, low noise figure (NF) LNA performance, high linearity, power efficiency, a small package footprint, low insertion loss, etc.). SOI can be differentiated from bulk processing technology which includes wells of doped silicon that extend deep into the substrate rather than stopping at an insulator layer above the substrate layer. Bulk transistors or devices include devices where the source and drain are built in the silicon substrate and dopants are added to the substrate to tune its conductive properties. As the sizes of the devices shrink (e.g., below about 28 nm), bulk transistors become increasingly complex and it is advantageous to build transistors using SOI technology.

The SOI structure includes a silicon film (e.g., crystalline silicon) separated from the bulk substrate by a thin layer of insulator (e.g., buried oxide or BOX). The BOX layer is configured to improve isolation, to reduce short channel effects, to reduce leakage current, to improve switching speed, etc. due at least in part to less drain-body capacitance. In SOI wafers, the insulator is typically a thermal silicon oxide ($SiO_2$) layer, and the substrate is a silicon wafer. Depending on the type of application, the silicon film can vary in thickness (e.g., from less than about 50 nm to tens of micrometers). Likewise, the thickness of the BOX can vary depending on the application (e.g., from tens of nanometers to several micrometers). SOI manufacturing technologies include separation by implanted oxygen (SIMOX), bond and etch-back SOI (BESOI), epitaxial layer transfer (ELTRAN®), NANOCLEAVE®, SMART CUT™, etc.

SOI technology can be implemented with complementary metal oxide semiconductors (CMOS). SOI CMOS involves building metal oxide semiconductor field effect transistors (MOSFETs) on the thin layer of semiconductor (e.g., silicon or germanium). The thin layer of semiconductor is separated from the substrate by an insulator layer (e.g., buried oxide) to electrically isolate the devices from the underlying semiconductor substrate and from each other. The thickness of the insulator layer of an SOI device can be anywhere between about 5 nm and about 400 nm and the thickness of the semiconductor film can be anywhere between about 5 nm and about 240 nm.

The MOSFETs on an SOI wafer include a channel depletion layer between source and drain. SOI devices can be classified into two types depending on the extent of the channel depletion layer compared to the thickness of the silicon film: partially depleted SOI (PDSOI) devices and fully depleted SOI (FDSOI) devices. PDSOI devices include devices where the silicon film is thicker than the maximum gate depletion width and the devices exhibit a floating-body effect. FDSOI devices include devices where the silicon film is thin enough for the entire film to be depleted before the threshold condition is reached.

FDSOI devices include an ultra-thin layer of insulator (buried oxide or BOX) positioned on top of the substrate and a very thin silicon film is used to form a transistor channel. FDSOI devices typically use undoped or a lightly doped channel. Typically, the thin film silicon layer is between about 5 nm and about 50 nm thick or typically about ¼ of the gate length. In addition, the insulating BOX layer may be thick (e.g., between about 100 nm and about 400 nm) or it may be ultra-thin (e.g., between about 5 nm and about 50 nm). For FDSOI devices, the silicon layer under the gate insulator is thin enough that it is fully depleted of mobile charge carriers, hence the device is "fully depleted." Stated another way, the depletion region reaches the buried oxide during switching of the FDSOI device from the OFF to the ON state The semiconductor film is very thin in FDSOI devices so that the depletion region covers the whole film. In FDSOI devices, the gate oxide (GOX) supports fewer depletion charges than the bulk device so an increase in inversion charges occurs resulting in higher switching speeds. Limitation of the depletion charge by the BOX induces a suppression of the depletion capacitance and therefore a substantial reduction of the subthreshold swing allowing FDSOI MOSFETs to work at lower gate bias resulting in lower power operation.

PDSOI devices include a thicker silicon layer on top of the BOX layer, relative to FDSOI devices. Typically, the top silicon layer is between about 50 nm and about 180 nm thick. The silicon under the channel is partially depleted of mobile charge carriers, thus the resulting device is "partially depleted." Typically, the BOX layer is between about 100 nm to about 400 nm thick.

Owing to its high integration capability and lower cost, CMOS technology is one of the most promising candidates for fully integrated FEICs. Typically, the most challenging device to build using CMOS technology is the high-power PA device, which traditionally uses laterally-diffused MOSFETs (LDMOS) or extended drain MOSFETs (EDMOS) for high power applications at low frequencies. LDMOS and EDMOS PAs are typically easier to build using bulk technology or thick film SOI technology. However, when the size of the device is small (e.g., about 28 nm or less), difficulties arise. For example, because the silicon film is really thin, manufacturing typically requires etching through the BOX layer on the wafer. Consequently, the resulting PA becomes comparable to a thick film or a bulk device rather than an FDSOI device. Existing CMOS technologies, whether being bulk CMOS, thick film SOI CMOS, or thin film SOI CMOS, all have drawbacks in either integrating switches and LNAs with LDMOS PAs, or in higher costs when integrating these elements.

Accordingly, to address these and other issues, described herein are SOI-based technology platforms that provide fully integrated FEICs that include switches, LNAs, and PAs. The PAs can be built in a thick film region of the integrated circuit, resulting in a PDSOI PA, and the switches and LNAs can be built in a thin film region of the integrated circuit, resulting in FDSOI switches and LNAs. The resulting fully integrated FEIC includes PDSOI PAs with FDSOI switches and LNAs. Passive components can be built in the thick film region, the thin film region, or both regions. In some implementations, a FEIC includes one or more power amplifiers in the thick film region with RF circuitry in the thin film region. In some implementations, a FEIC includes high voltage analog circuitry in the thick film region and lower power analog circuitry in the thin film region. In certain implementations, a FEIC includes an RF device implemented in the thick film region and analog and/or digital circuitry implemented in the thin film region.

Attempts to build a fully integrated FEIC have included building each device (PAs, LNAs, switches) using bulk technologies or building each device using PDSOI technologies. Attempts have also included building bulk LDMOS or EDMOS PAs (e.g., through removal of the BOX layer) with FDSOI LNAs and switches. Attempts have also included building PDSOI LDMOS or EDMOS PAs with LNAs in a thick film region and switches in a locally thinned thin film region.

In contrast to these attempts, disclosed herein are fully integrated FEICs with FDSOI switches and LNAs in addition to PDSOI PAs. In the disclosed embodiments, there is no removal of the BOX layer in contrast to the attempts described above. Instead, switches and LNAs are built in a thin film region and the PAs are built in a thick film region. This can be accomplished by starting with a thin film, building the switches and LNAs, building up a thick film region (e.g., using selective epitaxial growth or SEG), and building the PAs in the built-up thick film region. This can also be accomplished by starting with a thick film, building the PAs in the thick film region, using local thinning to create a thin film region, and building the switches and LNAs in the formed thin film region. This can also be accomplished by preparing the BOX layer and thin film layer, increasing the thickness of a portion of the thin film region to create a thick film region and then building the FDSOI LNA and switch devices in the thin film region and building the PDSOI PA devices in the thick film region. This can also be accomplished by preparing the BOX layer and thick film layer, decreasing the thickness of a portion of the thick film region to create a thin film region and then building the PDSOI PA devices in the thick film region and building the FDSOI LNA and switch devices in the thin film region.

The disclosed FEICs are thus fully integrated CMOS front end integrated circuits with improved performance and lower cost. Some embodiments of the resulting structure of the disclosed FEIC includes a thin film region with one or more FDSOI switches and one or more FDSOI LNAs and a thick film region with one or more PDSOI PAs (e.g., LDMOS PAs or EDMOS PAs). In the disclosed FEICs, passive components can be built in the thick film region (with the PAs), the thin film region (with the switches and the LNAs), or in both regions. In some embodiments, the disclosed FEIC includes one or more devices in the thick film region that form a high voltage analog circuit which may include a high voltage power amplifier and/or low-dropout regulator. In some embodiments, the disclosed FEIC includes a RF device (e.g., a PA) in the thick film region and low voltage analog circuitry and/or digital circuitry in the thin film region.

Advantageously, the disclosed FEICs decrease parasitics for the PAs relative to bulk implementations. This results in higher active device performance and other ultimate performance advantages of the FEICs. Another advantage of the disclosed FEICs is that there is no need to remove a portion of the buried oxide layer to build the devices (e.g., PAs) in the thick film region. Consequently, the integrated circuit in the thick film region can have a thicker silicon film or layer relative to certain implementations of integrated circuits with FDSOI PAs or PAs in a thin film region. As a result, there is more robust active device performance and higher performance for passive devices in the thick film region. This improves the overall performance of the disclosed FEICs.

Front End Integrated Circuit Structure

FIG. 1A illustrates a fully integrated front end integrated circuit 100a (FEIC) fabricated using silicon-on-insulator (SOI) processing technologies. The FEIC 100a includes a substrate 102 (e.g., a handle wafer) and an insulator layer 104 (e.g., buried oxide (BOX)) on top of the substrate 102, and an active device layer or silicon layer 106 (e.g., a silicon film such as crystalline silicon) on top of the insulator layer 104. In some embodiments, the BOX layer 104 can have a thickness between about 100 nm and about 400 nm. The silicon layer 106 forms a thick film region 108a and a thin film region 108b. In some embodiments, the thick film region 108a can have a thickness between about 50 nm and about 180 nm. In some embodiments, the thin film region 108b can have a thickness between about 5 nm and about 50 nm thick. In certain implementations, the thick film region 108a is at least about 2 times as thick as the thin film region 108b, or at least about 2.5 times as thick and/or less than or equal to about 20 times as thick, or at least about 5 times as thick and/or less than or equal to about 15 times as thick.

A partially depleted SOI (PDSOI) power amplifier (PA) device 110 is formed in the thick film region 108a. A fully depleted SOI (FDSOI) low noise amplifier (LNA) device 120 and a FDSOI switch device 130 are formed in the thin film region 108b. The PDSOI PA device 110, the FDSOI LNA device 120, and the FDSOI switch device 130 can each comprise an n-MOSFET and/or a p-MOSFET.

The PDSOI PA device 110 includes a MOSFET that has a gate structure with a gate conductor 112 (e.g., polysilicon) and a gate insulator 119 (e.g., an oxide). One or more spacers may also be used. The PDSOI PA device 110 includes a source diffusion 114 and a drain diffusion 116. In certain implementations, the source diffusion 114 and/or the drain diffusion 116 can extend through the depth of the silicon layer 106 to reach or almost reach the insulator layer 104. In some embodiments, the drain diffusion 116 can be configured so that the PDSOI PA device 110 is a laterally diffused MOSFET (LDMOS) or an extended drain MOSFET (ED-MOS). The PDSOI PA device 110 includes a channel 118 under the gate insulator 119 between the source diffusion 114 and the drain diffusion 116. The channel 118 can be doped to achieve targeted performance characteristics. The channel 118 can be configured to have a thickness such that the depletion layer partially covers the space under the gate insulator 119 when the PDSOI PA device 110 is in the ON state. Hence, the PDSOI PA device 110 is partially depleted due at least in part to being built in the thick film region 108a.

The FDSOI LNA device 120 is similar to the PDSOI PA device 110 in that it includes a gate with a gate conductor 122 and a gate insulator 129, a source diffusion 124, a drain diffusion 126, and a channel 128 under the gate insulator 129. In the FDSOI LNA device 120, the channel 128 is configured to have a thickness such that the depletion layer covers the space under the gate insulator 129 when the FDSOI LNA device 120 is in the ON state. Hence, the FDSOI LNA device 120 is fully depleted due at least in part to being built in the thin film region 108b. In some embodiments, the channel 128 is undoped or lightly doped.

The FDSOI switch device 130 is similar to the FDSOI LNA device 120 in that it includes a gate with a gate conductor 132 and a gate insulator 139, a source diffusion 134, a drain diffusion 136, and a channel 138 under the gate insulator 139. The channel 138 is configured to have a thickness such that the depletion layer covers the space under the gate insulator 139 when the FDSOI switch device 130 is in the ON state. Hence, the FDSOI switch device 130 is fully depleted due at least in part to being built in the thin film region 108b. In some embodiments, the channel 138 is undoped or lightly doped.

The FEIC 100a includes a substrate 102, an insulator layer 104 on top of the substrate 102, and a semiconductor layer 106 on top of the insulator layer 104. The semiconductor layer 106 forms a thin film region 108b and a thick film region 108a. The thin film region 108b includes one or more FDSOI LNA devices 120 and one or more FDSOI switch devices 130. The thick film region 108a includes one or more PDSOI PA devices 110. Thus, the semiconductor layer 106 is thinner in the LNA device 120 and the switch device 130 than it is in the PA device 110.

Figure 1B:
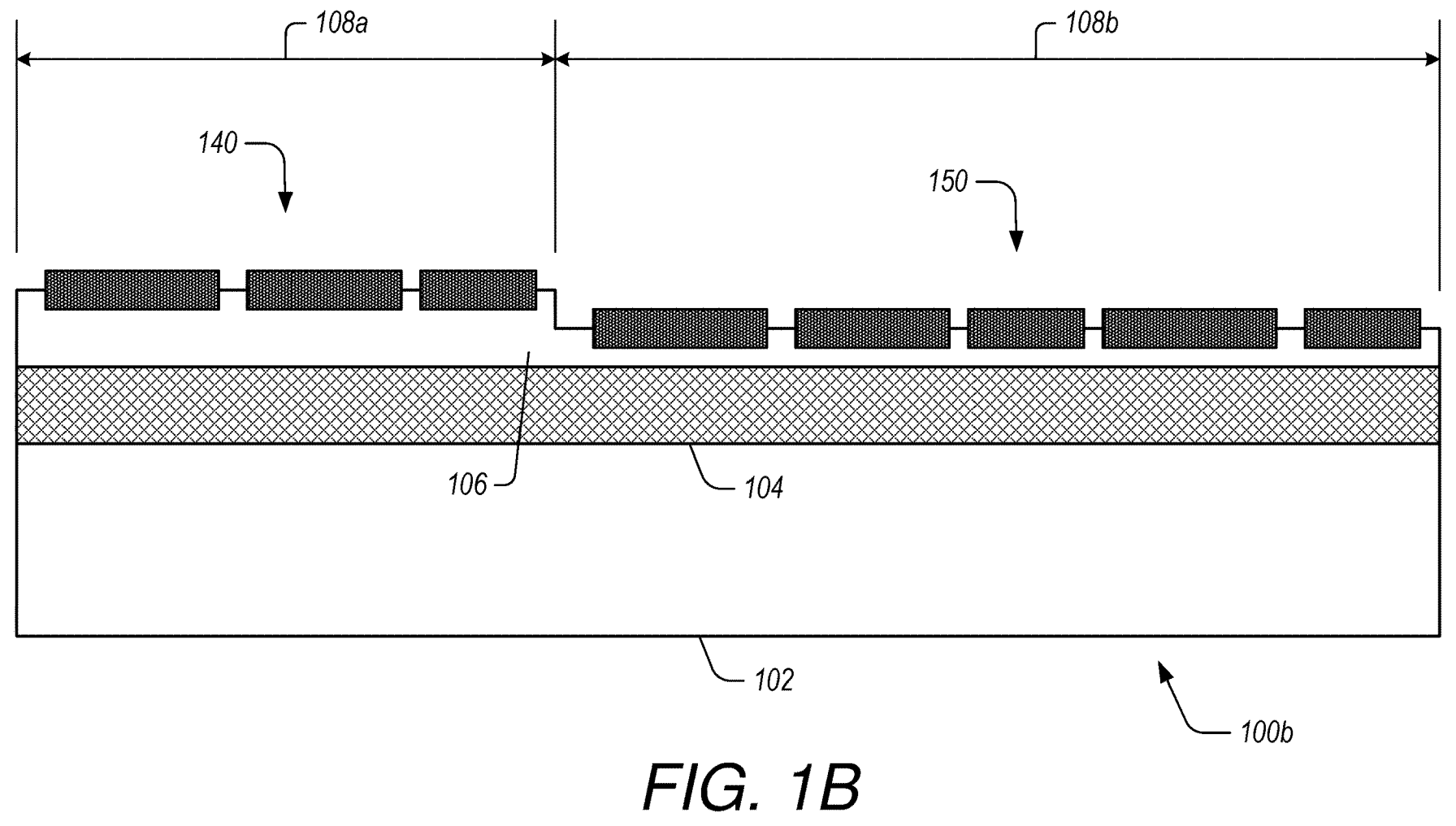

FIG. 1B illustrates another fully integrated FEIC 100b fabricated using SOI processing technologies. The FEIC 100*b* includes the same structure as the FEIC 100*a* in that it includes the substrate 102, the insulator layer 104 on top of the substrate 102, and the semiconductor layer 106 on top of the insulator layer 104. The semiconductor layer 106 forms the thin film region 108*b* and the thick film region 108*a*. The thick film region 108*a* includes various thick film devices 140. In some embodiments, the thick film devices 140 can include analog circuitry (e.g., high voltage PAs, LDOs, high voltage breakdown, ESD protection, charge pumps, high power switches, power control unit, etc.). The thin film region 108*b* includes various thin film devices 150. In some embodiments, the thin film devices 150 can include analog circuitry (e.g., low power analog circuitry, level shifters, summing devices, current mirrors, etc.) and/or digital circuitry (e.g., logic gates). Thus, the semiconductor layer 106 is thinner in the region of the thin film devices 150 than it is in the region of the thick film devices 140. In some embodiments, the thick film region 108*a* of the FEIC 100*b* is used for high voltage analog circuitry. In such embodiments, the thin film region 108*b* may be used for RF circuitry. In certain embodiments, the thick film region 108*a* of the FEIC 100*b* is used for RF circuitry (e.g., PAs) and the thin film region 108*b* is used for analog (e.g., low power analog circuitry) and/or digital circuitry (e.g., logic gates).

FIGS. 2A, 2B, 2C, and 2D illustrate an example FEIC 200 at different stages in a manufacturing process. The FEIC 200 is similar to the FEIC 100*a*, 100*b* in that it includes a substrate 102 and an insulator layer 104 on the substrate 102. The substrate 102 can be a silicon support wafer or a handle wafer. The insulator layer 104 can be buried oxide such as silicon dioxide. In some embodiments, the insulator layer 104 can have a thickness between about 100 nm and about 400 nm.

Figure 2A:
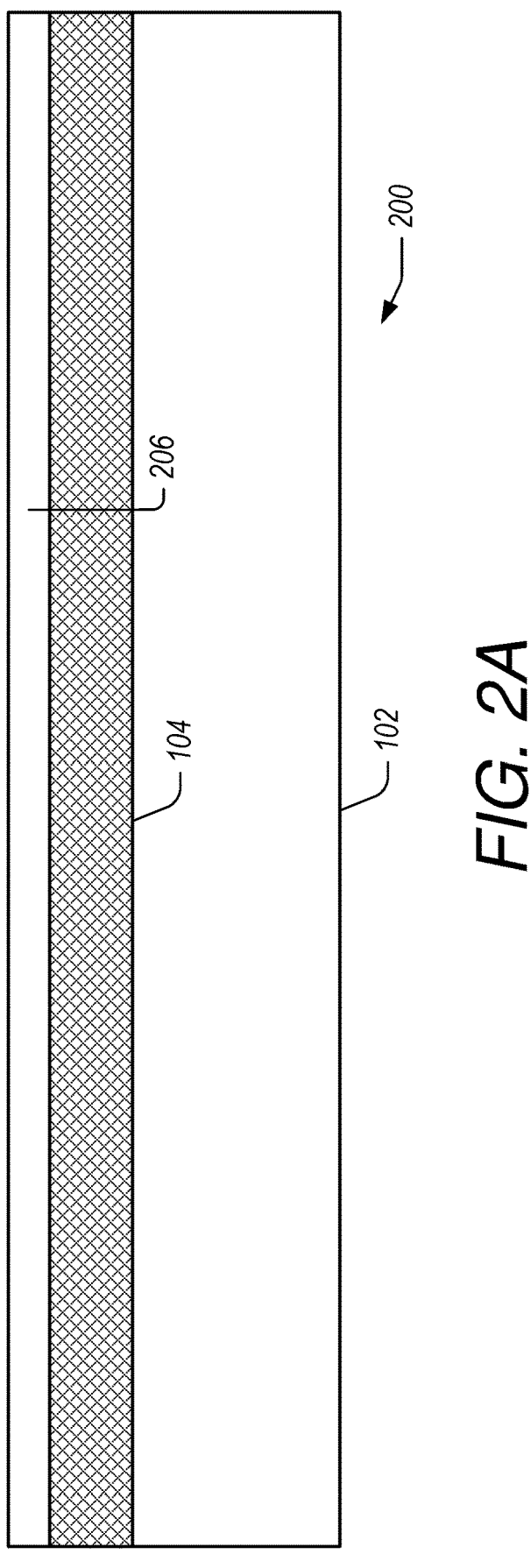

In FIG. 2A, the FEIC 200 includes an active layer or silicon layer 206 of substantially uniform thickness. The silicon layer 206 can be a silicon film. The thickness of the silicon layer 206 can be suitable for building FDSOI devices. For example, the thickness of the silicon layer 206 can be between about 5 nm and about 50 nm thick or about ¼ of a gate length of an FDSOI device to be built in the silicon layer 206.

Figure 2B:
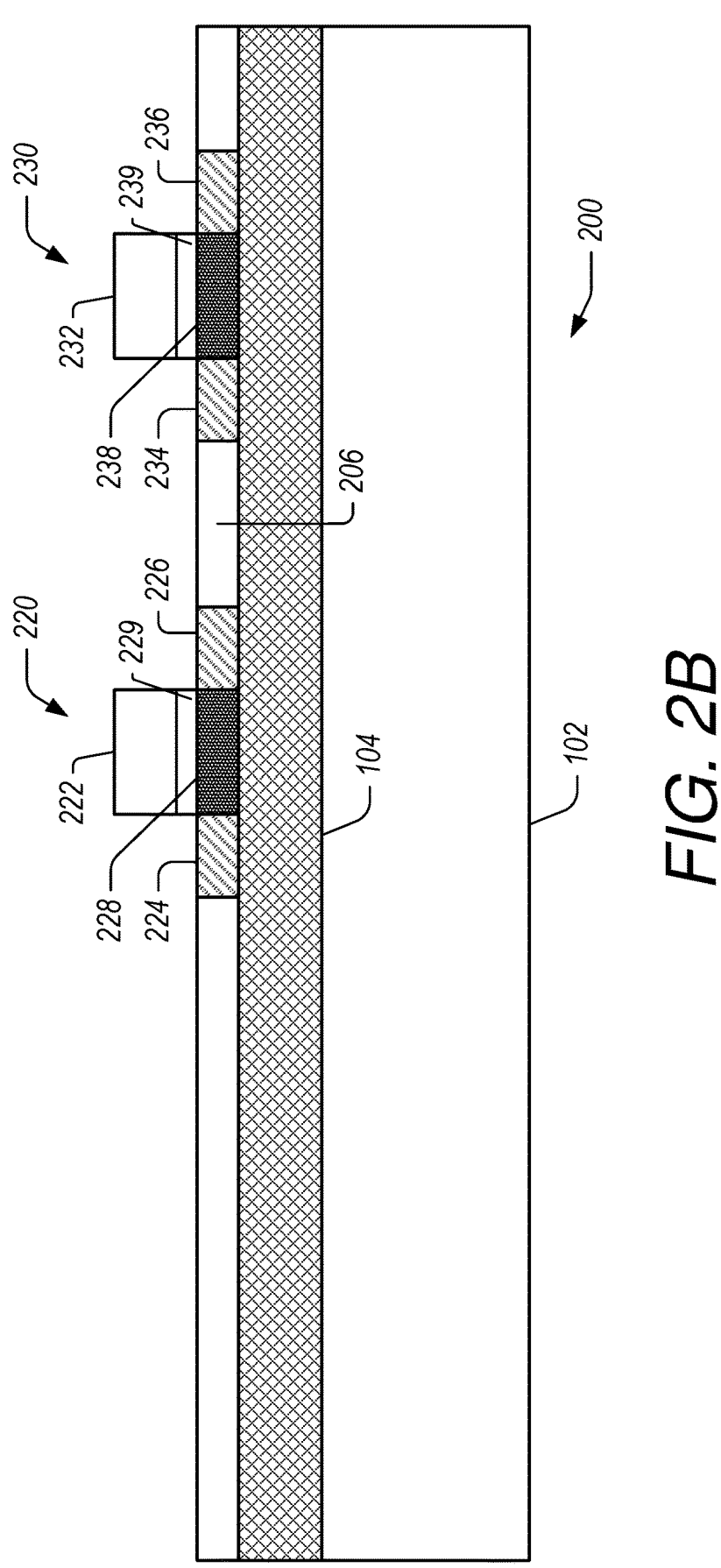

In FIG. 2B, the FEIC 200 includes a FDSOI LNA device 220 and a FDSOI switch device 230. The FDSOI LNA device 220 is similar to the FDSOI LNA device 120 of FIG. 1A, in that it includes a gate structure with a gate conductor 222 over a gate insulator 229, a source diffusion 224, a drain diffusion 226, and a channel 228. The FDSOI switch device 230 is similar to the FDSOI switch device 130 of FIG. 1A, in that it includes a gate structure with a gate conductor 232 over a gate insulator 239, a source diffusion 234, a drain diffusion 236, and a channel 238. It should be understood that, although a single FDSOI LNA device 220 is illustrated, a plurality of FDSOI LNA devices can be built in the silicon layer 206. It should also be understood that, although a single FDSOI switch device 230 is illustrated, a plurality of FDSOI switch devices can be built in the silicon layer 206.

Figure 2C:
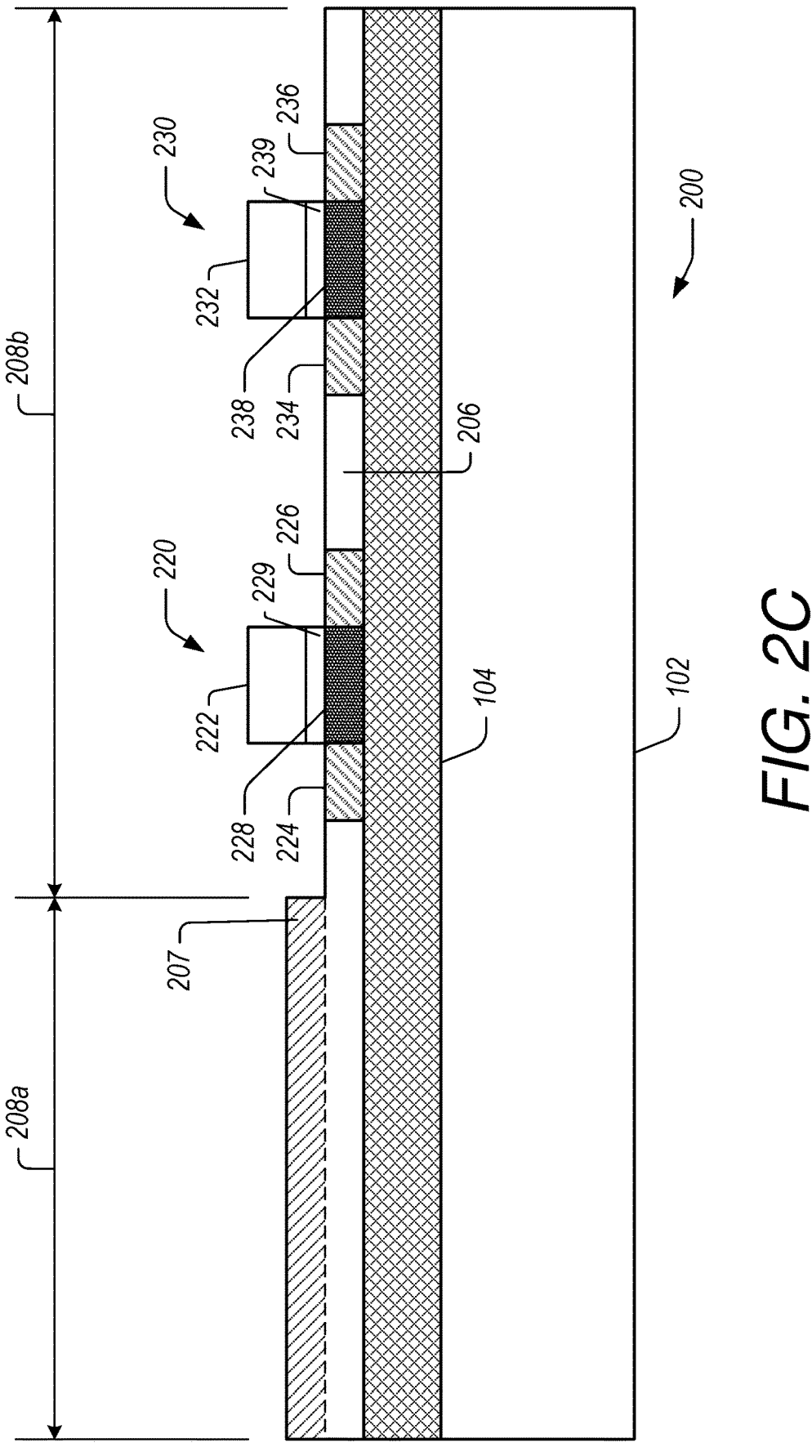

In FIG. 2C, the FEIC 200 includes a built-up region 207 that increases the thickness of the silicon film 206 in a targeted area. The built-up portion 207 can be built on the silicon film 206 using any suitable process. An example of a process to build up a silicon film is selective epitaxial growth (SEG). For example, using SEG, a portion of the silicon layer 206 that does not include any FDSOI devices can be built up.

The built-up portion 207 results in a thick film region 208*a* of the silicon layer 206 having a thickness greater than a thin film region 208*b* of the silicon layer 206. The resulting thickness of the thick film region 208*a* can be suitable for building PDSOI devices. For example, the thickness of the silicon layer 206 in the thick film region 208*a* can be between about 50 nm and about 180 nm. This built-up portion 207 is illustrated as a cross-hatched portion on top of the silicon layer 206, but it is to be understood that the resulting increase in thickness of the silicon film 206 does not necessarily result in an additional layer on top of the silicon layer 206. Rather, the additional thickness of the built-up portion 207 represents an increase in thickness of the silicon layer 206 itself.

Figure 2D:
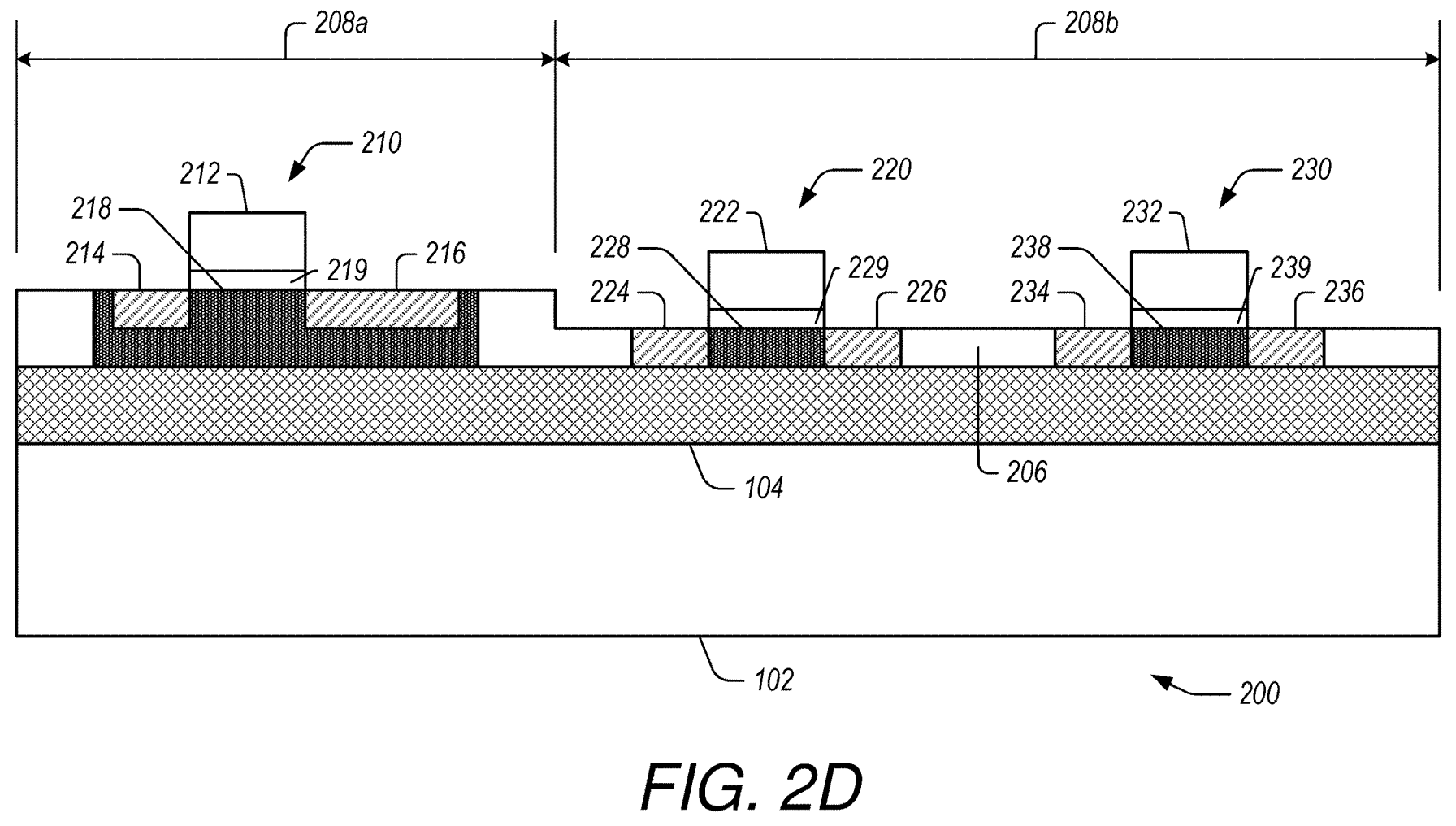

In FIG. 2D, the FEIC 200 includes a PDSOI PA device 210 built in the thick film region 208*a* of the silicon layer 206. The PDSOI PA device 210 is similar to the PDSOI PA device 110 of FIG. 1A, in that it includes a gate structure with a gate conductor 212 over a gate insulator 219, a source diffusion 214, a drain diffusion 216, and a well 218. The PDSOI PA device 210 can be a LDMOS PA device or an EDMOS PA device. It should be understood that, although a single PDSOI PA device 210 is illustrated, a plurality of PDSOI PA devices can be built in the silicon layer 206. The FEIC 200 can include passive devices in either or both of the thick film region 208*a* and the thin film region 208*b*.

By way of example, a suitable method for manufacturing the FEIC 200 includes forming the insulator layer 104 on top of the substrate 102. The method includes forming a semiconductor layer 206 on top of the insulator layer 104. The method includes building the FDSOI LNA device 220 in the semiconductor layer 206. The method includes building the FDSOI switch device 230 in the semiconductor layer 206. The method includes increasing a thickness of a portion of the semiconductor layer 206 to form a thick film region 208*a* of the semiconductor layer 206. The method includes building the PDSOI PA device 210 in the thick film region 208*a* of the semiconductor layer 206, such that the FDSOI LNA device 220 and the FDSOI switch device 230 are in the thin film region 208*b* of the semiconductor layer 206 and the PDSOI PA device 210 is in the thick film region 208*a* of the semiconductor layer 206.

Figure 3A:
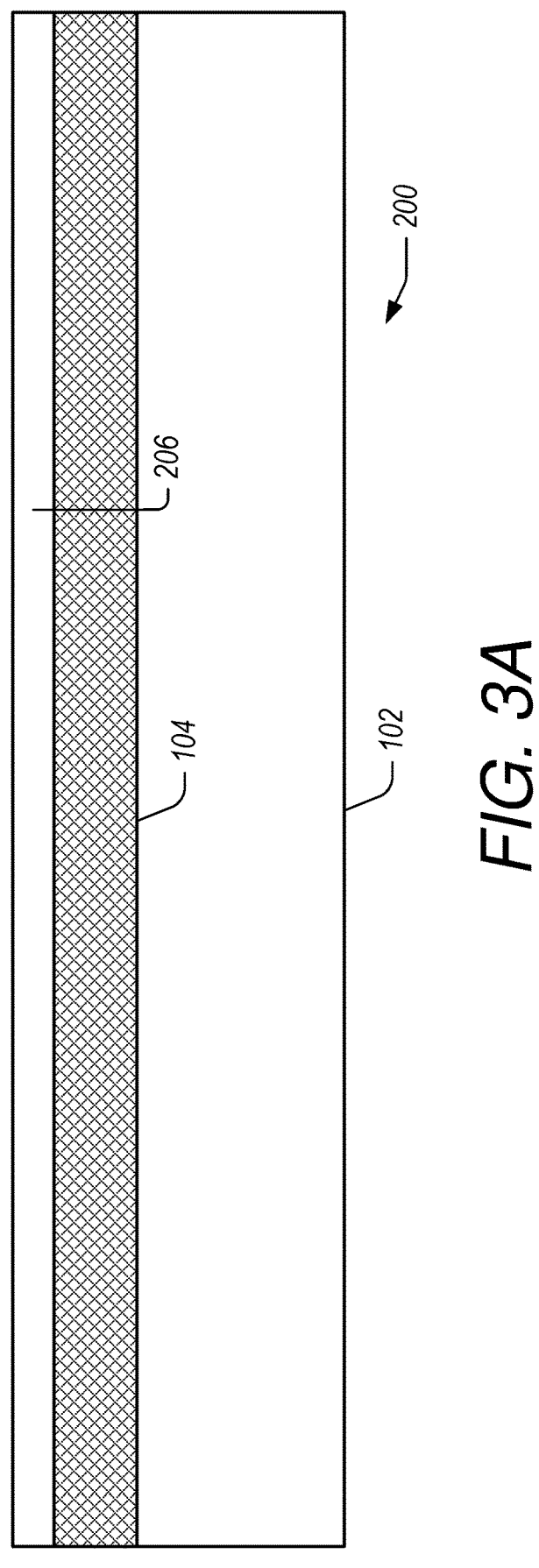
Figure 3B:
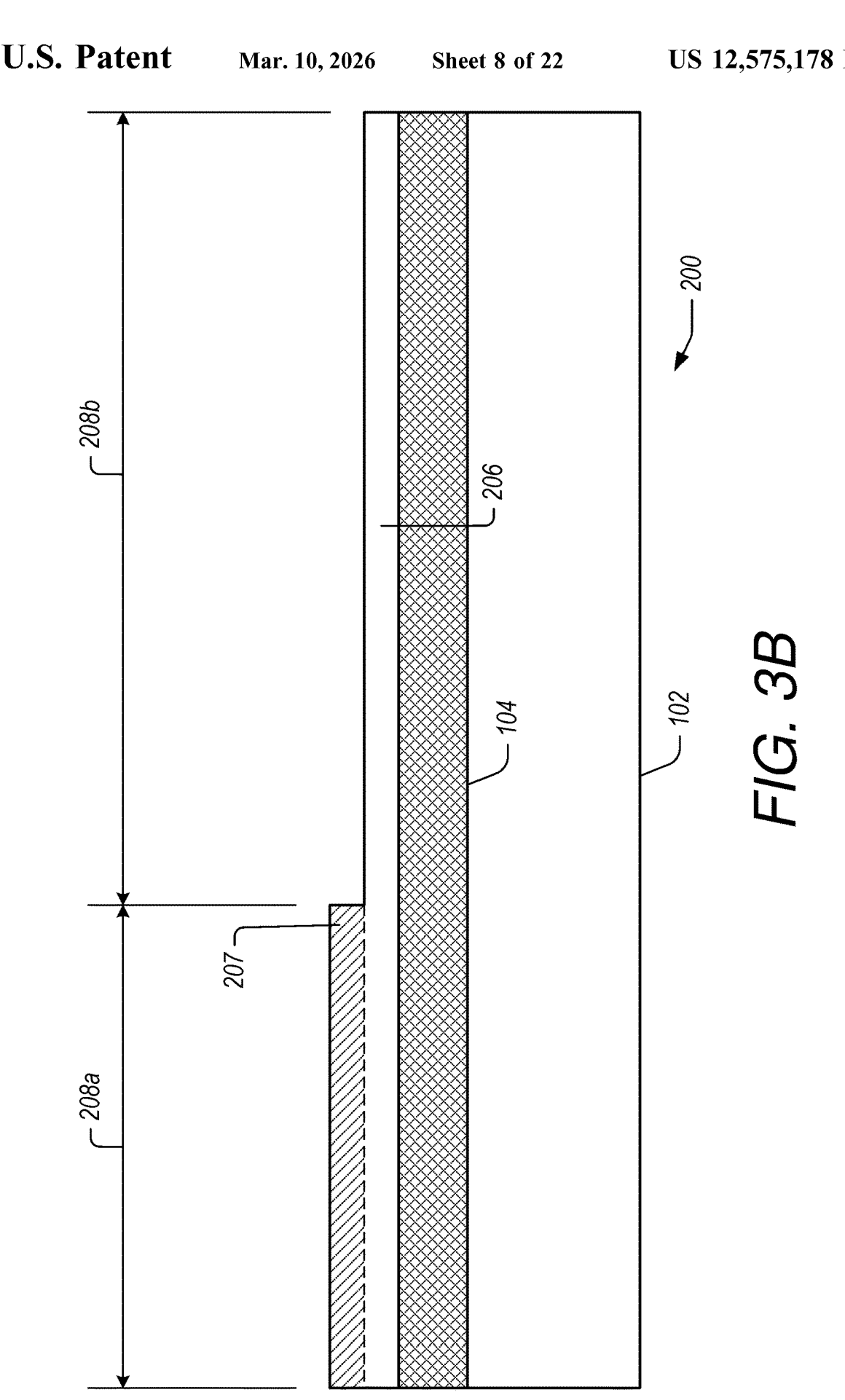
Figure 3C:
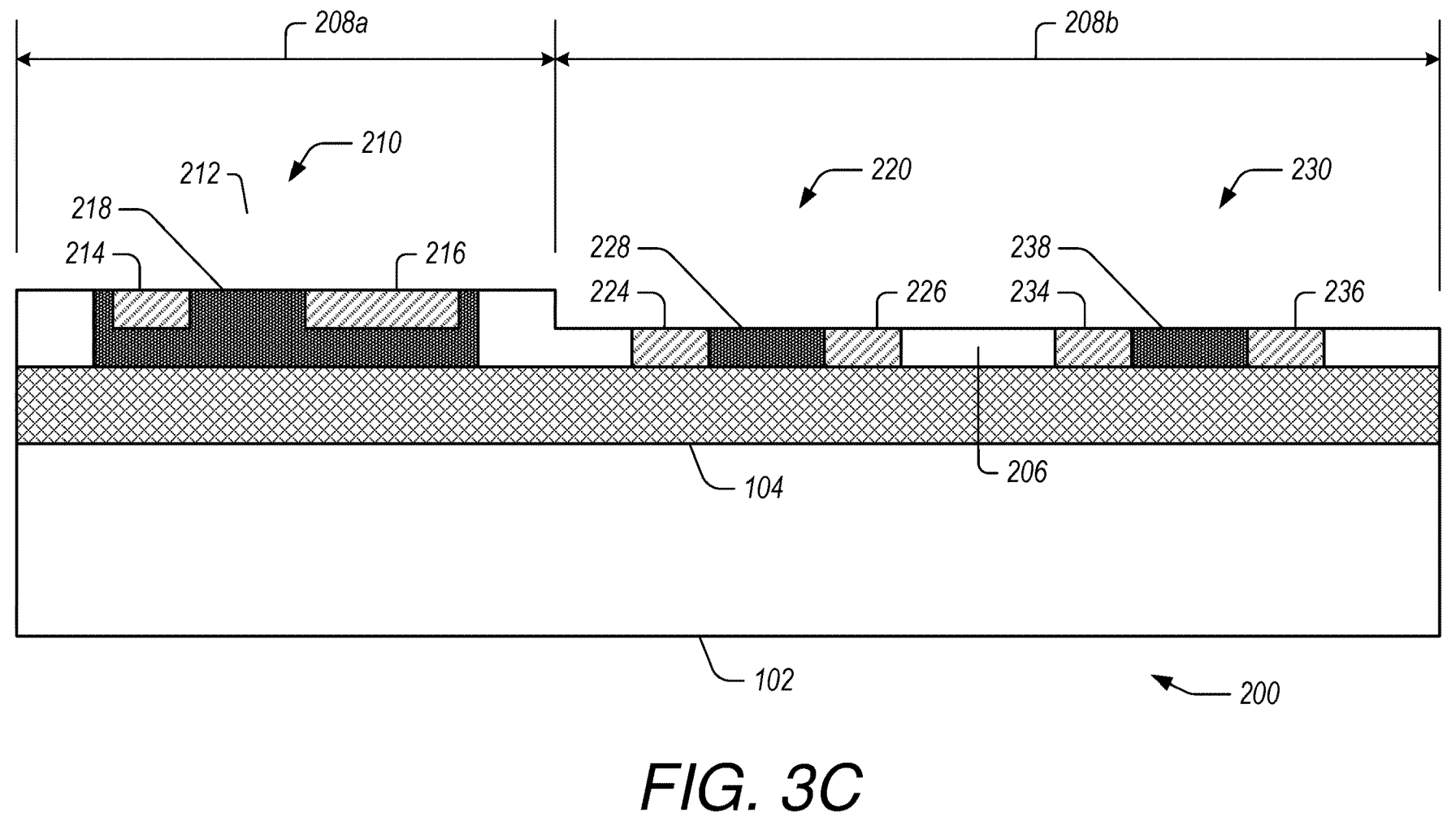
Figure 3D:
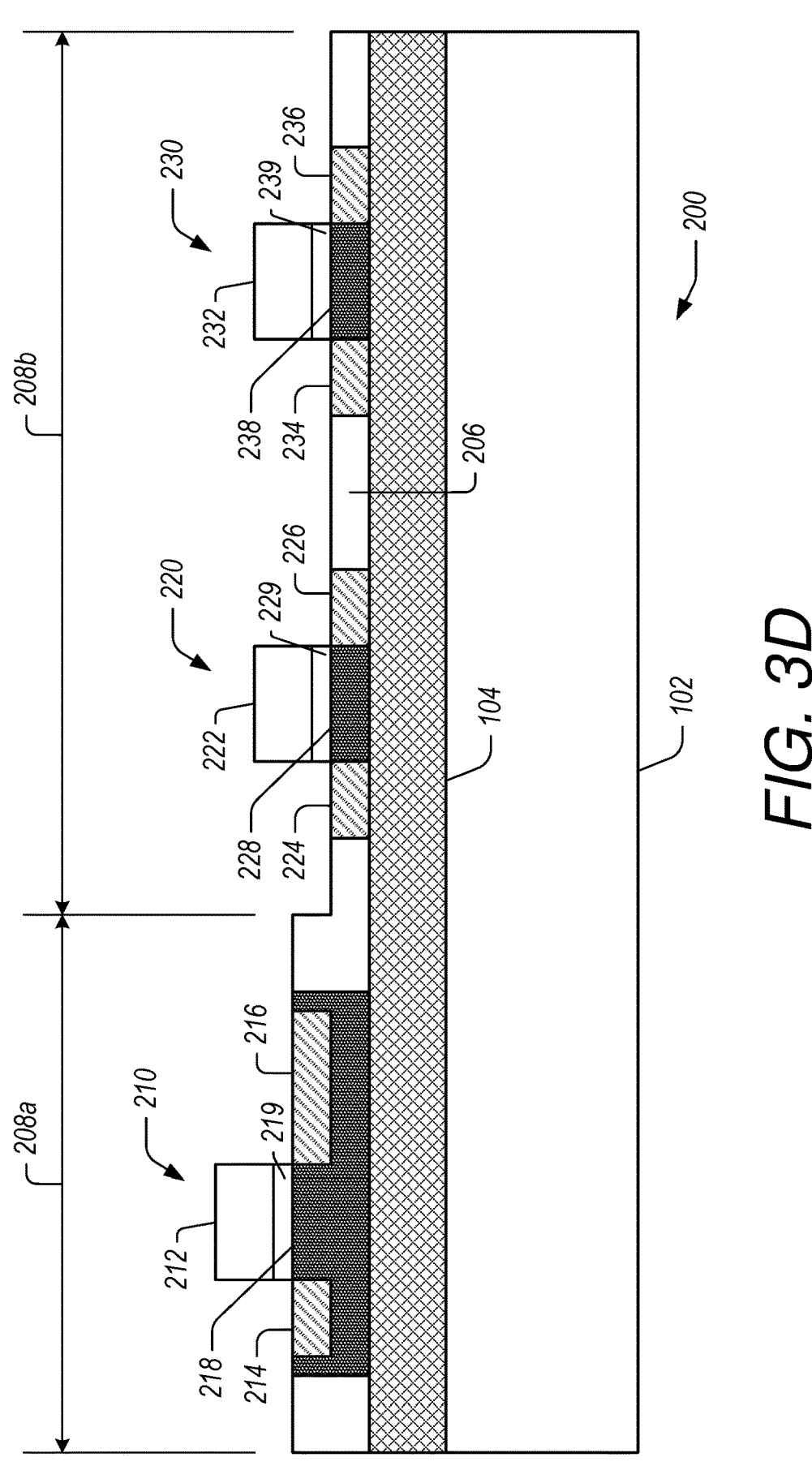

FIGS. 3A, 3B, 3C, and 3D illustrate a variation on the process for building the FEIC 200 described with respect to FIGS. 2A-2D. In this variation, the FEIC 200 starts with a thin silicon layer 206, as illustrated in FIG. 3A. In FIG. 3B, the built-up region 207 of the FEIC is formed prior to forming devices in the thin film region 208*b*. The built-up portion 207 can be built on the silicon film 206 using any suitable process such as SEG. The built-up portion 207 results in the thick film region 208*a* of the silicon layer 206 having a thickness greater than the thin film region 208*b* of the silicon layer 206. The resulting thickness of the thick film region 208*a* can be suitable for building PDSOI devices, e.g., between about 50 nm and about 180 nm. This built-up portion 207 is illustrated as a cross-hatched portion on top of the silicon layer 206, but it is to be understood that the resulting increase in thickness of the silicon film 206 does not necessarily result in an additional layer on top of the silicon layer 206. Rather, the additional thickness of the built-up portion 207 represents an increase in thickness of the silicon layer 206 itself. Once the thick film region 208*a* is formed, the devices 210, 220, 230 can be built in the thick film region 208*a* and the thin film region 208*b*, as described herein with reference to FIGS. 2B and 2D. FIG. 3C illustrates that the source diffusions 214, 224, 234 and the drain diffusions 216, 226, 236 can be formed along with the channels 218, 228, 238. In some embodiments, after these have been formed, FIG. 3D illustrates that the gate insulators 219, 229, 239 between the respective source and drain diffusions can be formed with the gate conductors 212, 222, 232 formed above the respective gate insulators. In certain implementations, the mask used to build the gate insulator 219 can be shared with the mask used for the gate insulators 229, 239. Similarly, the mask used to build the gate conductor 212 can be shared with the mask used for the gate conductors 222, 232.

FIGS. 4A, 4B, 4C, and 4D illustrate another example FEIC 300 at different stages in a manufacturing process. The FEIC 300 is similar to the FEIC 100a in that it includes a substrate 102 and an insulator layer 104 on the substrate 102. The substrate 102 can be a silicon support wafer or a handle wafer. The insulator layer 104 can be buried oxide such as silicon dioxide. In some embodiments, the insulator layer 104 can have a thickness between about 100 nm and about 400 nm.

Figure 4A:
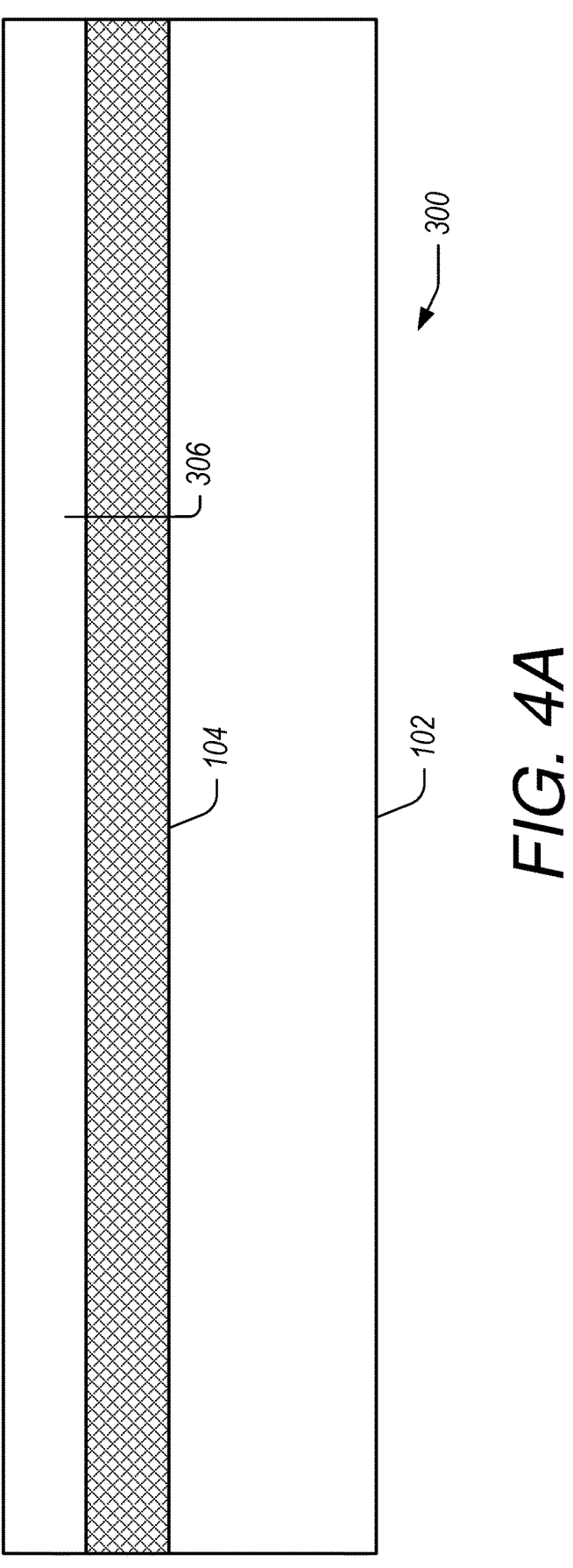
FIGS. 4A, 4B, 4C, and 4D illustrate another example FEIC at different stages in a manufacturing process.

In FIG. 4A, the FEIC 300 includes an active layer or silicon layer 306 of substantially uniform thickness. The silicon layer 306 can be a silicon film. The thickness of the silicon layer 306 can be suitable for building PDSOI devices. For example, the thickness of the silicon layer 306 can be between about 50 nm and about 180 nm thick.

Figure 4B:
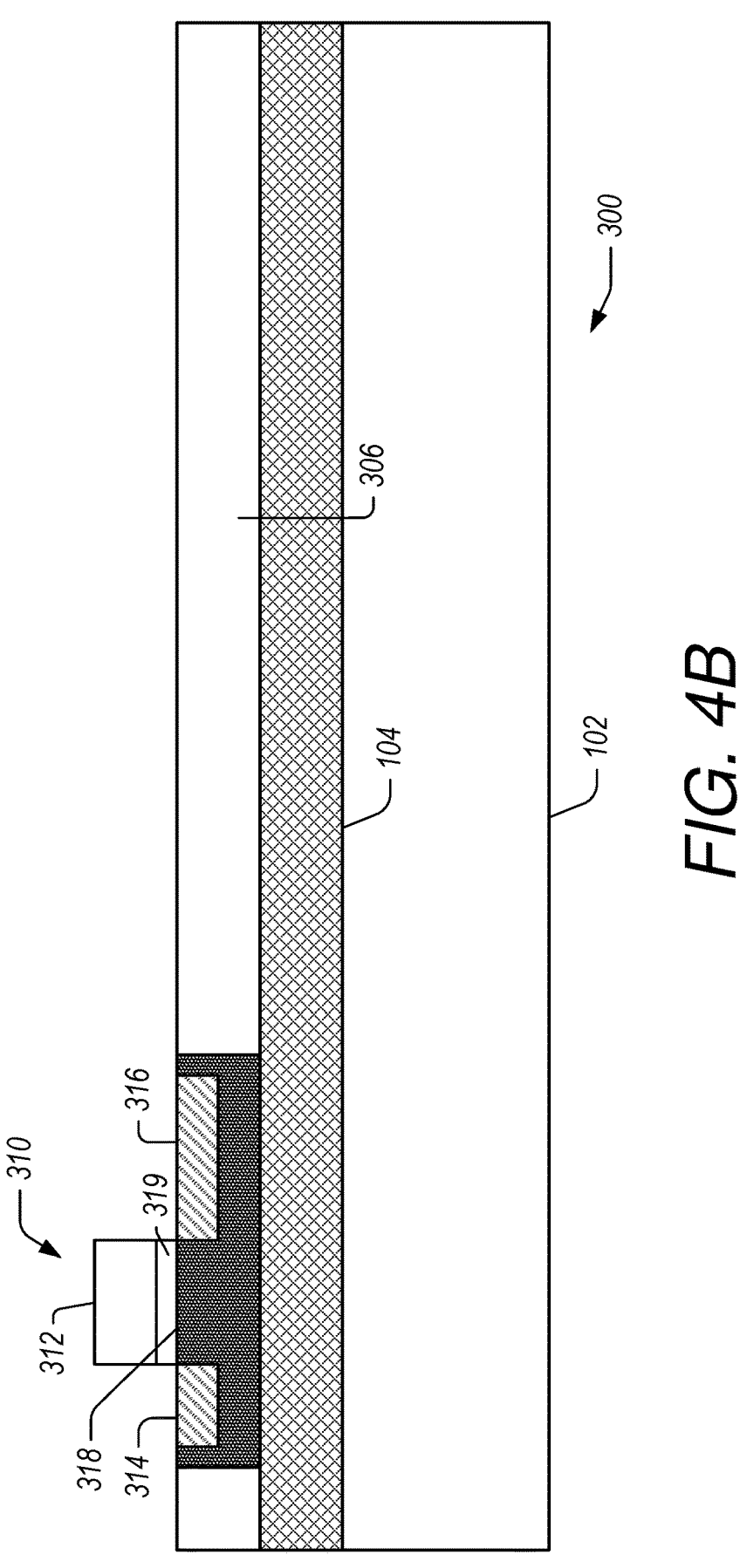

In FIG. 4B, the FEIC 300 includes a PDSOI PA device 310 built in the silicon layer 306. The PDSOI PA device 310 is similar to the PDSOI PA device 110 of FIG. 1A, in that it includes a gate structure with a gate conductor 312 over a gate insulator 319, a source diffusion 314, a drain diffusion 316, and a well 318. The PDSOI PA device 310 can be a LDMOS PA device or an EDMOS PA device. It should be understood that, although a single PDSOI PA device 310 is illustrated, a plurality of PDSOI PA devices can be built in the silicon layer 306.

Figure 4C:
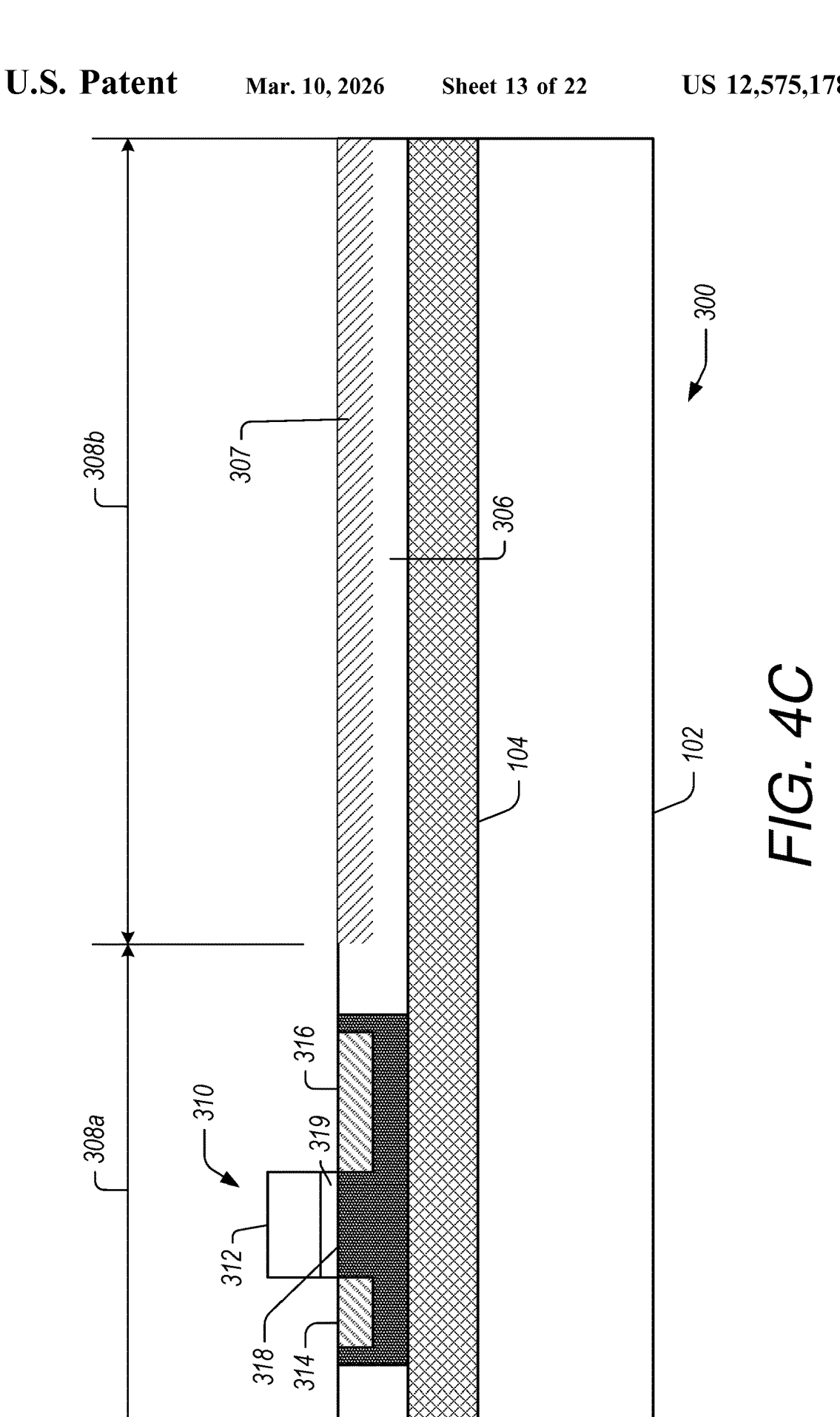

In FIG. 4C, the FEIC 300 includes a region 307 that represents a portion of the silicon layer 306 that has been removed to decrease the thickness of the silicon layer 306 in a targeted area. The removed portion 307 can be removed from the silicon film 306 using any suitable process. An example of a process to remove a portion of a silicon film is local thinning. For example, using local thinning, a portion of the silicon layer 306 that does not include any PDSOI devices can be removed.

The removed portion 307 results in a thick film region 308a of the silicon layer 306 having a thickness greater than a thin film region 308b of the silicon layer 306. The resulting thickness of the thin film region 308b can be suitable for building FDSOI devices. For example, the thickness of the silicon layer 306 in the thin film region 308b can be between about 5 nm and about 50 nm or about ¼ of the gate length of a FDSOI device to be built in the thin film region 308b.

Figure 4D:
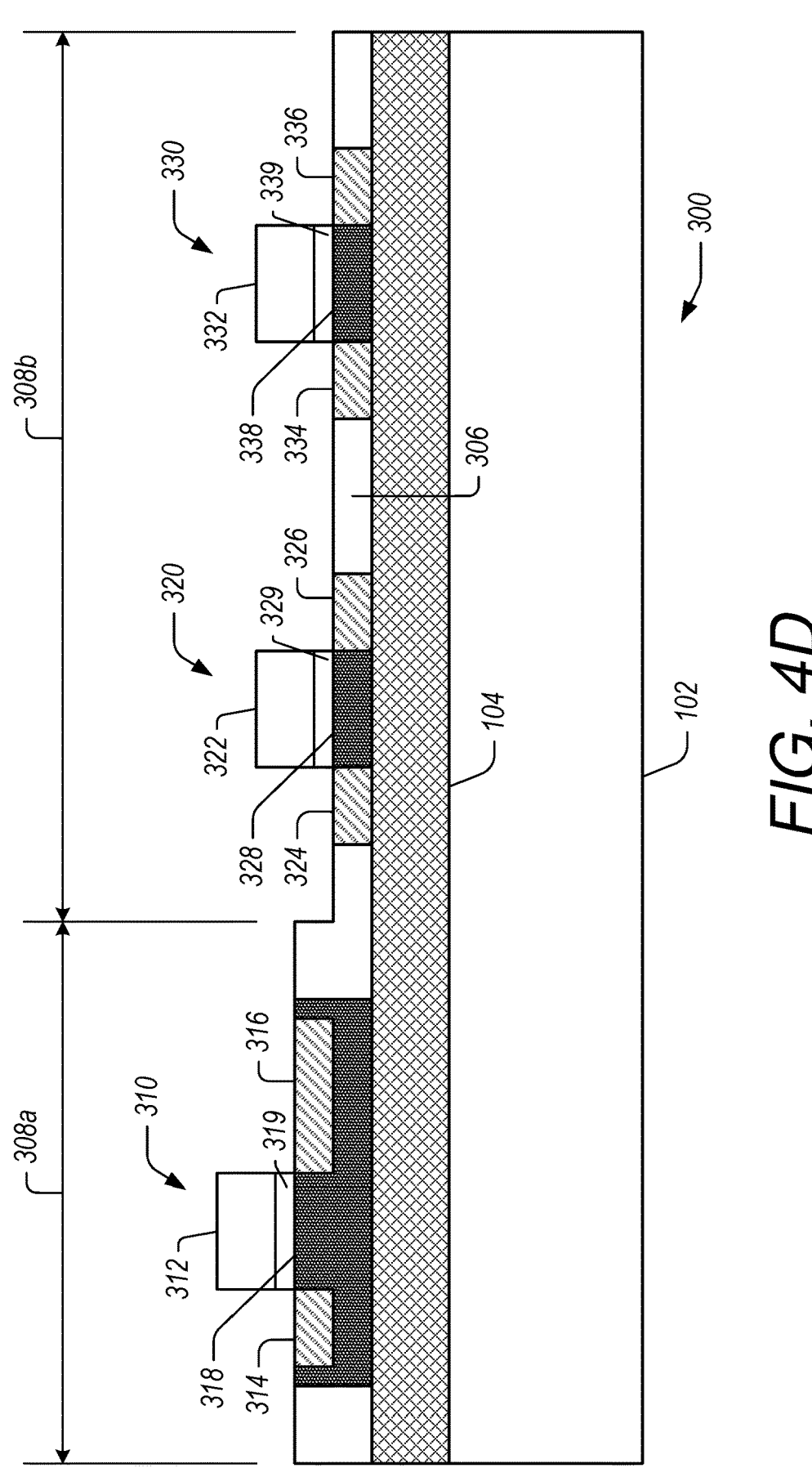

In FIG. 4D, the FEIC 300 includes a FDSOI LNA device 320 and a FDSOI switch device 330. The FDSOI LNA device 320 is similar to the FDSOI LNA device 120 of FIG. 1A, in that it includes a gate structure with a gate conductor 322 over a gate insulator 329, a source diffusion 324, a drain diffusion 326, and a channel 328. The FDSOI switch device 330 is similar to the FDSOI switch device 130 of FIG. 1A, in that it includes a gate structure with a gate conductor 332 over a gate insulator 339, a source diffusion 334, a drain diffusion 336, and a channel 338. It should be understood that, although a single FDSOI LNA device 320 is illustrated, a plurality of FDSOI LNA devices can be built in the silicon layer 306. It should also be understood that, although a single FDSOI switch device 330 is illustrated, a plurality of FDSOI switch devices can be built in the silicon layer 306. The FEIC 300 can include passive devices in either or both of the thick film region 308a and the thin film region 308b.

By way of example, a suitable method for manufacturing the FEIC 300 includes forming the insulator layer 104 on top of the substrate 102. The method also includes forming a semiconductor layer 306 on top of the insulator layer 104. The method also includes building the PDSOI PA device 310 in the semiconductor layer 306. The method also includes decreasing the thickness of a portion of the semiconductor layer 306 to form the thin film region 308b of the semiconductor layer 306. The method also includes building the FDSOI LNA device 320 in the thin film region 308b of the semiconductor layer 306. The method also includes building the FDSOI switch device 330 in the thin film region 308b of the semiconductor layer 306. The PDSOI PA device 310 is in the thick film region 308a of the semiconductor layer 306 and the FDSOI LNA device 320 and the FDSOI switch device 330 are in the thin film region 308b of the semiconductor layer 306.

Figure 5A:
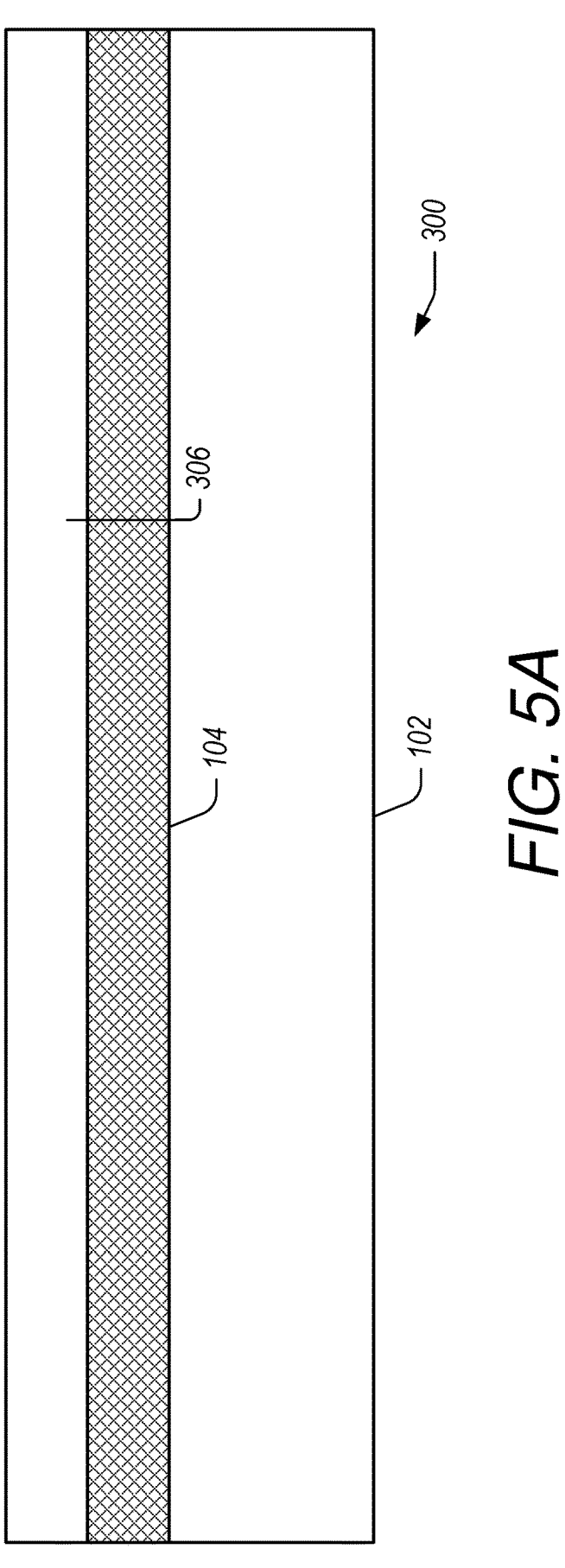
Figure 5B:
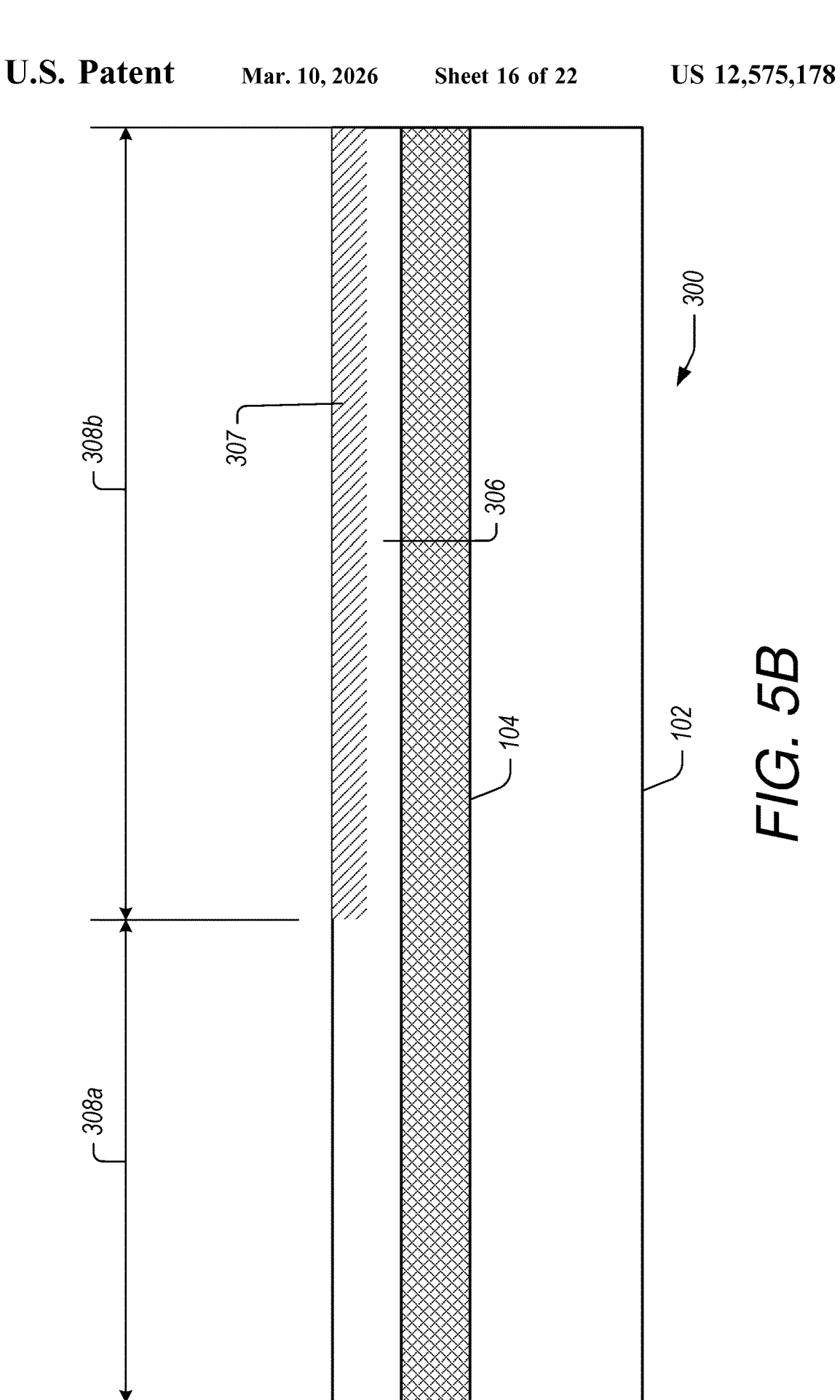
Figure 5C:
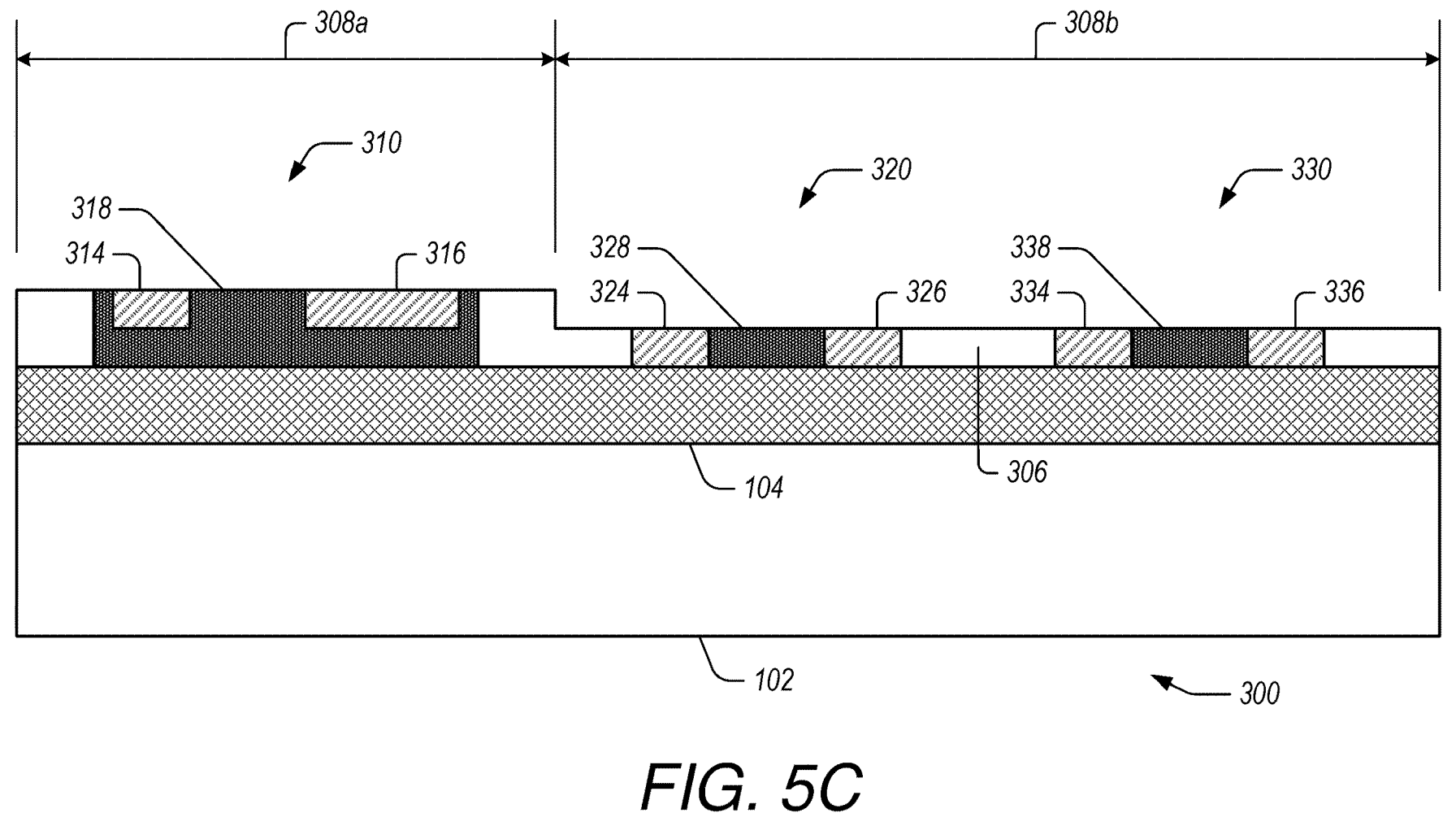
Figure 5D:
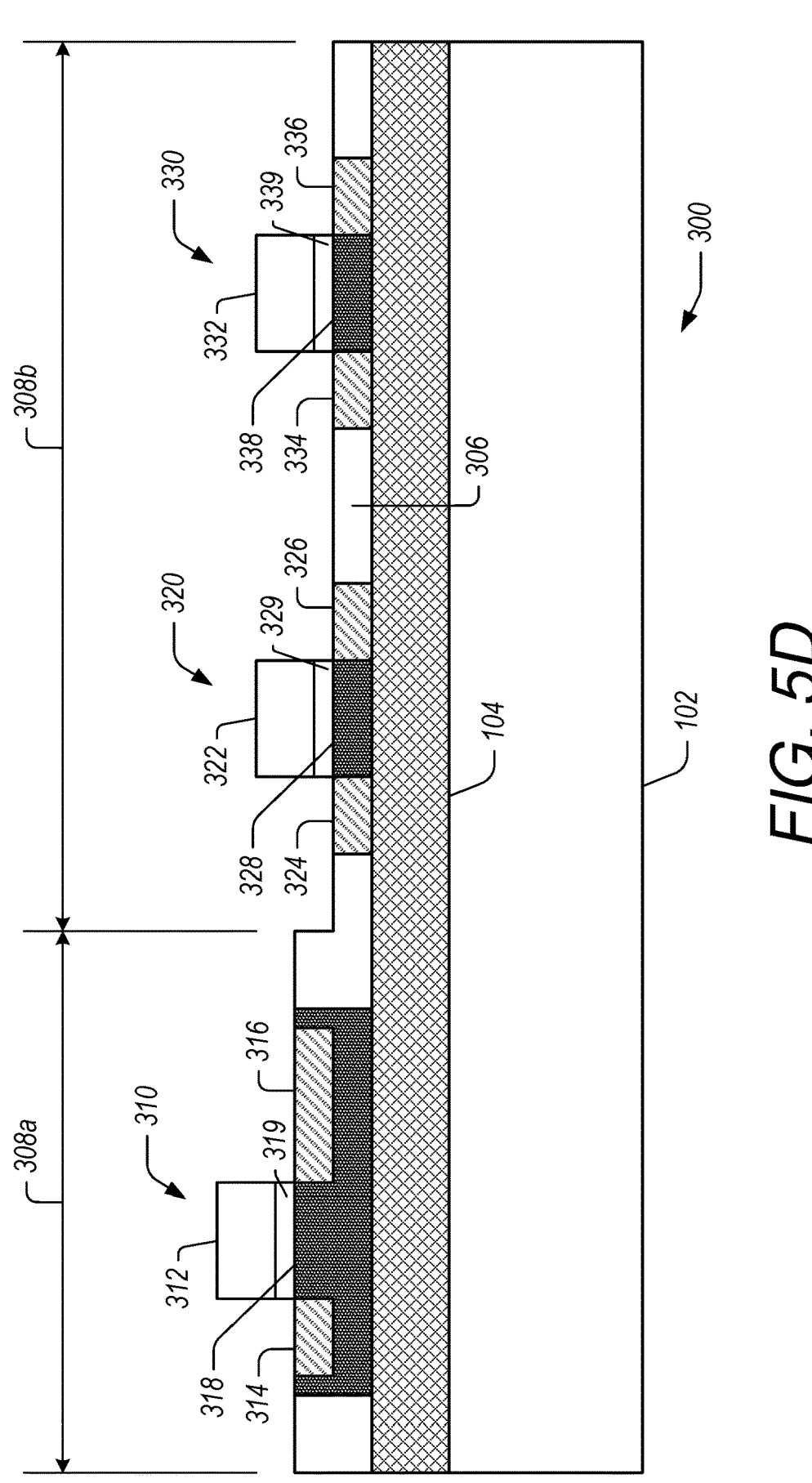

FIGS. 5A, 5B, 5C, and 5D illustrate a variation on the process for building the FEIC 300 described with respect to FIGS. 4A-4D. In this variation, the FEIC 300 starts with a thick silicon layer 306, as illustrated in FIG. 5A. In FIG. 5B, the FEIC 300 includes a region 307 that represents a portion of the silicon layer 306 that has been removed to decrease the thickness of the silicon layer 306 in a targeted area. The removed portion 307 can be removed from the silicon film 306 using any suitable process, such as local thinning. The removed portion 307 results in the thick film region 308a of the silicon layer 306 having a thickness greater than the thin film region 308b of the silicon layer 306. The resulting thickness of the thin film region 308b can be suitable for building FDSOI devices, e.g., between about 5 nm and about 50 nm or about ¼ of the gate length of a FDSOI device to be built in the thin film region 308b. Once the thin film region 308b is formed, the devices 310, 320, 330 can be built in the thick film region 308a and the thin film region 308b, as described herein with reference to FIGS. 4B and 4D. FIG. 5C illustrates that the source diffusions 314, 324, 334 and the drain diffusions 316, 326, 336 can be formed along with the channels 318, 328, 338. In some embodiments, after these have been formed, FIG. 5D illustrates that the gate insulators 319, 329, 339 between the respective source and drain diffusions can be formed with the gate conductors 312, 322, 332 formed above the respective gate insulators. In certain implementations, the mask used to build the gate insulator 319 can be shared with the mask used for the gate insulators 329, 339. Similarly, the mask used to build the gate conductor 312 can be shared with the mask used for the gate conductors 322, 332.

Manufacturing Front End Integrated Circuits

Figure 6A:
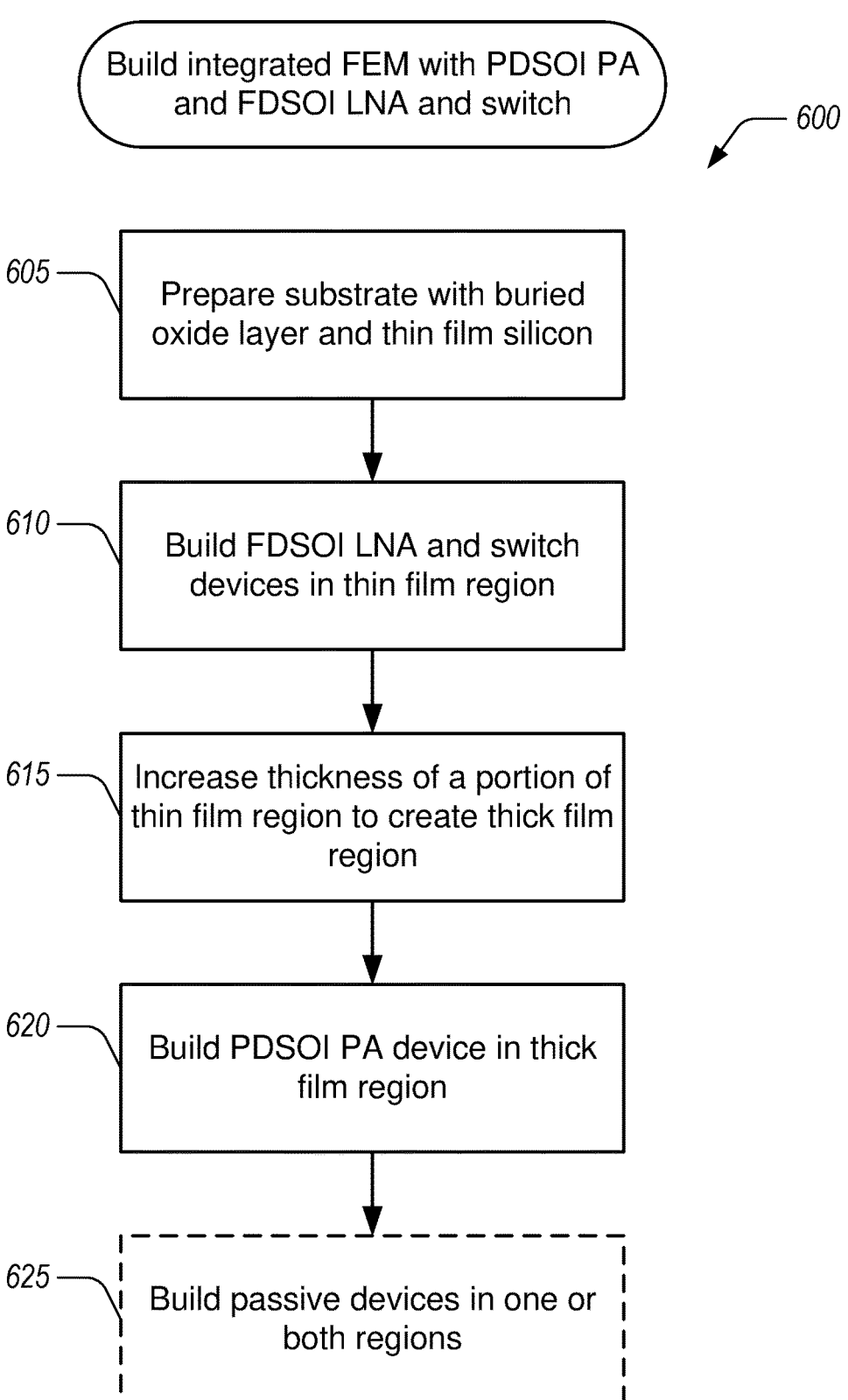
FIGS. 6A and 6B illustrate methods for building an integrated FEIC with a partially depleted silicon-on-insulator (PDSOI) power amplifier (PA) device, a fully depleted silicon-on-insulator (FDSOI) low noise amplifier (LNA) device, and a FDSOI switch device.

FIG. 6A illustrates a method 600 for building an integrated front end integrated circuit (FEIC) with a partially depleted silicon-on-insulator (PDSOI) power amplifier (PA) device, a fully depleted silicon-on-insulator (FDSOI) low noise amplifier (LNA) device, and a FDSOI switch device. FIGS. 2A-2D represent examples of a FEIC being manufactured corresponding to the steps of the method 600.

At block 605, a substrate with a buried oxide (BOX) layer and a thin film silicon layer is prepared. The substrate with the BOX layer and thin film silicon can be in the form of a silicon-on-insulator (SOI) wafer, for example. Preparation of the SOI wafer can occur in a separate process such that the step at block 605 includes receiving or providing the SOI wafer rather than requiring manufacturing of the SOI wafer. Preparation can also include any step performed to prepare the structure to enable building active devices in the thin film silicon layer. FIG. 2A represents an example of the FEIC at block 605.

The substrate can be a handle wafer. The BOX layer can be any suitable insulator, such as a thermal silicon oxide (SiO2). The thin film silicon layer can be a thin film deposited over the BOX, such as crystalline silicon. The thickness of the BOX layer can be anywhere between about 5 nm and about 400 nm, and may be at least about 100 nm and/or less than or equal to about 200 nm, sometimes referred to as a thick BOX layer as compared to a thin or ultra-thin BOX layer that is typically between about 5 nm and about 50 nm. The thickness of the thin film silicon layer can be between about 5 nm and about 50 nm or about ¼ of the gate length of an active device to be built into the thin film silicon layer. Any suitable process can be used to prepare the SOI wafer, including separation by implanted oxygen (SIMOX), bond and etch-back SOI (BESOI), epitaxial layer transfer (ELTRAN®), NANOCLEAVE®, SMART CUT™, etc.

At bock 610, one or more FDSOI LNA devices and one or more FDSOI switch devices are built in the thin film silicon layer. These active devices can be built without doping the channel between their source and drain diffusions or the channel can be lightly doped. The thickness of the thin film silicon can be such that the channel is fully depleted when the active devices are in the ON state. FIG. 2B represents an example of the FEIC at block 610.

At block 615, the thickness of a region of the thin film silicon is increased to create a thick film region that does not include any FDSOI active devices. Consequently, the region of the thin film silicon that is not subjected to the process to thicken the silicon film layer can be referred to as a thin film region of the silicon layer, the thin film region including the one or more FDSOI LNA devices and the one or more FDSOI switch devices. The thickness of the resulting thick film region can be between about 50 nm and about 180 nm. FIG. 2C represents an example of the FEIC at block 615.

Epitaxial deposition processes, or epitaxy, can be used to increase the thickness of the silicon layer. These processes can be used to grow a layer of silicon (e.g., crystalline silicon) over a silicon film (e.g., crystalline silicon) or substrate. Selective epitaxial growth (SEG) is one such example process that can be used to grow silicon on exposed silicon areas of a silicon film. Regions where silicon growth is not desired can be masked by a dielectric film, typically silicon dioxide or silicon nitride. Epitaxial growth can include condensation of liquid or gas precursors to form a film on a substrate. Gas precursors can be obtained by chemical vapor deposition and/or laser ablation, for example.

At block 620, one or more PDSOI PA devices are built in the thick film region. The one or more PDSOI PA devices can be LDMOS and/or EDMOS PA devices. The thickness of the thick film silicon can be such that the channel is partially depleted when the active devices are in the ON state. FIG. 2D represents an example of the FEIC at block 620. Optionally at block 625, passive devices can be built in the thin film region, the thick film region, or both the thin film region and the thick film region.

The method 600 provides a number of advantages. For example, the associated parasitics are less with LDMOS PA devices and EDMOS PA devices on SOI as compared to implementations using bulk technologies. This leads to better or improved active device performance. As another example, the buried oxide layer can be a thick BOX layer (rather than an ultra-thin layer) to achieve desired performance characteristics. This results in more robust active device performance, higher power capabilities, and improved passive device performance. As another example, the resulting FEIC has the benefits of both FDSOI active devices (e.g., the switch devices and the LNA devices) as well as PDSOI active devices (e.g., the PA devices).

Figure 6B:
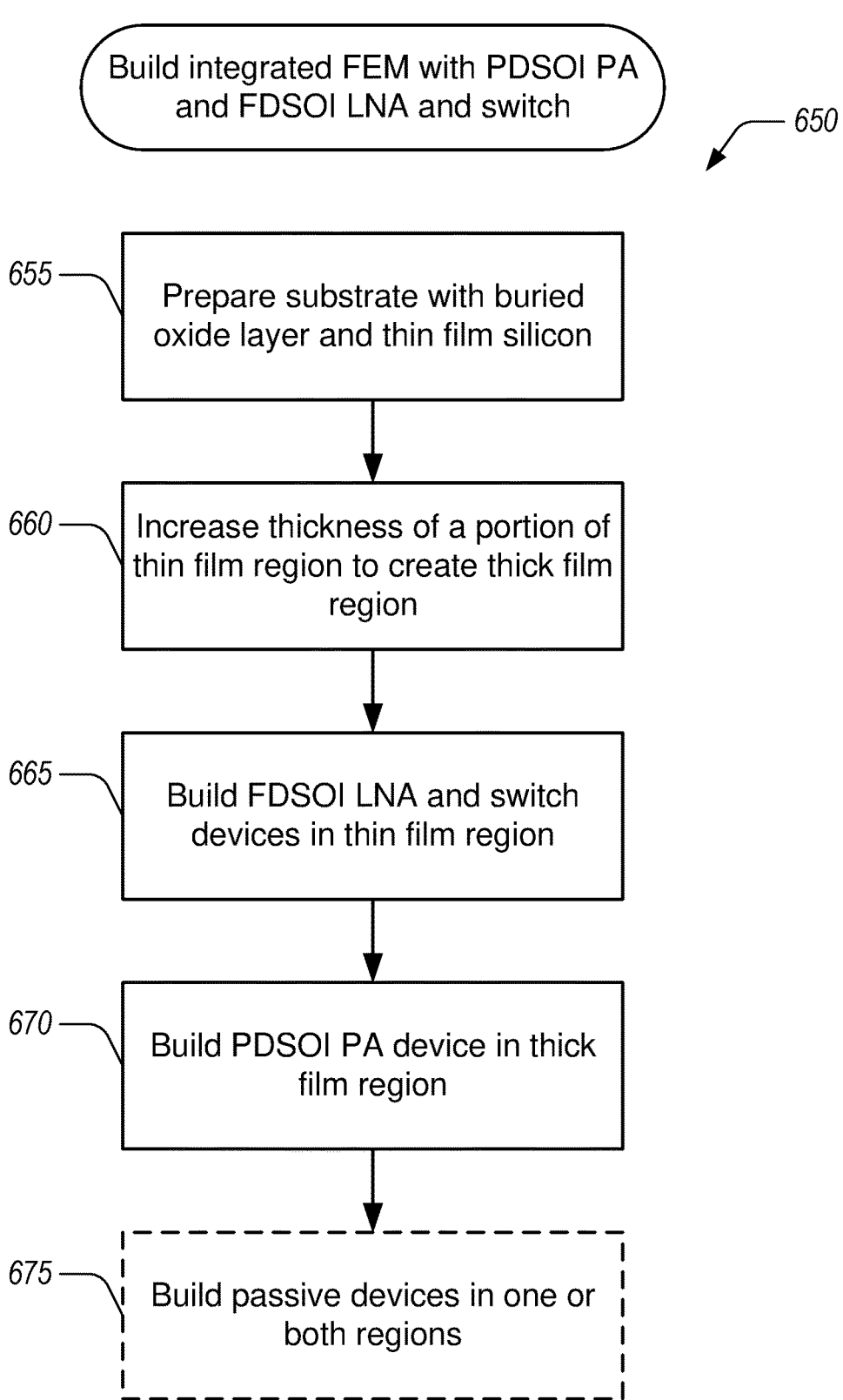

FIG. 6B illustrates a method 650 for building an integrated FEIC with a PDSOI PA device, a FDSOI LNA device, and a FDSOI switch device. FIGS. 3A-3D represent examples of a FEIC being manufactured corresponding to the steps of the method 650. It should be noted that the method 650 is substantially similar to the method 600 described with reference to FIG. 6A and thus shares the advantages of the method 600. A difference between the methods 600 and 650 is an order of the steps of the methods such that the method 650 prepares the substrate prior to building devices. In particular, the method 650 switches the order of building the devices in the thin film region and increasing the thickness of a portion of the thin film region to create the thick film region. Accordingly, the description of the method 650 will be abbreviated, relying on the description of the method 600 to provide details for the method 650.

At block 655, a substrate with a BOX layer and a thin film silicon layer is prepared and may be in the form of a SOI wafer, for example. FIG. 3A represents an example of the FEIC at block 655.

At block 660, the thickness of a region of the thin film silicon is increased to create a thick film region. Consequently, the region of the thin film silicon that is not subjected to the process to thicken the silicon film layer can be referred to as a thin film region of the silicon layer. The thickness of the resulting thick film region can be between about 50 nm and about 180 nm. FIG. 3B represents an example of the FEIC at block 660.

At bock 665, one or more FDSOI LNA devices and one or more FDSOI switch devices are built in the thin film region of the silicon layer. These active devices can be built without doping the channel between their source and drain diffusions or the channel can be lightly doped. The thickness of the thin film silicon can be such that the channel is fully depleted when the active devices are in the ON state. At block 670, one or more PDSOI PA devices are built in the thick film region. The one or more PDSOI PA devices can be LDMOS and/or EDMOS PA devices. The thickness of the thick film silicon can be such that the channel is partially depleted when the active devices are in the ON state. Optionally at block 675, passive devices can be built in the thin film region, the thick film region, or both the thin film region and the thick film region.

FIGS. 3C and 3D represents an example of the FEIC at blocks 665 and 670. It should be understood that although the blocks 665 and 670 indicate that devices are built in the thin film region and then built in the thick film region, other implementations of the method 650 include partially building devices in the thin film region and the thick film region (e.g., as illustrated in FIG. 3C) and then completing the devices in both regions (e.g., as illustrated in FIG. 3D). In some implementations, shared masks may be used to complete the devices, as described herein. This may also apply to the method 600 where devices are partially built in the thin film region and the thick film region and then completed at a separate step with shared masks potentially being used in some instances.

Figure 7A:
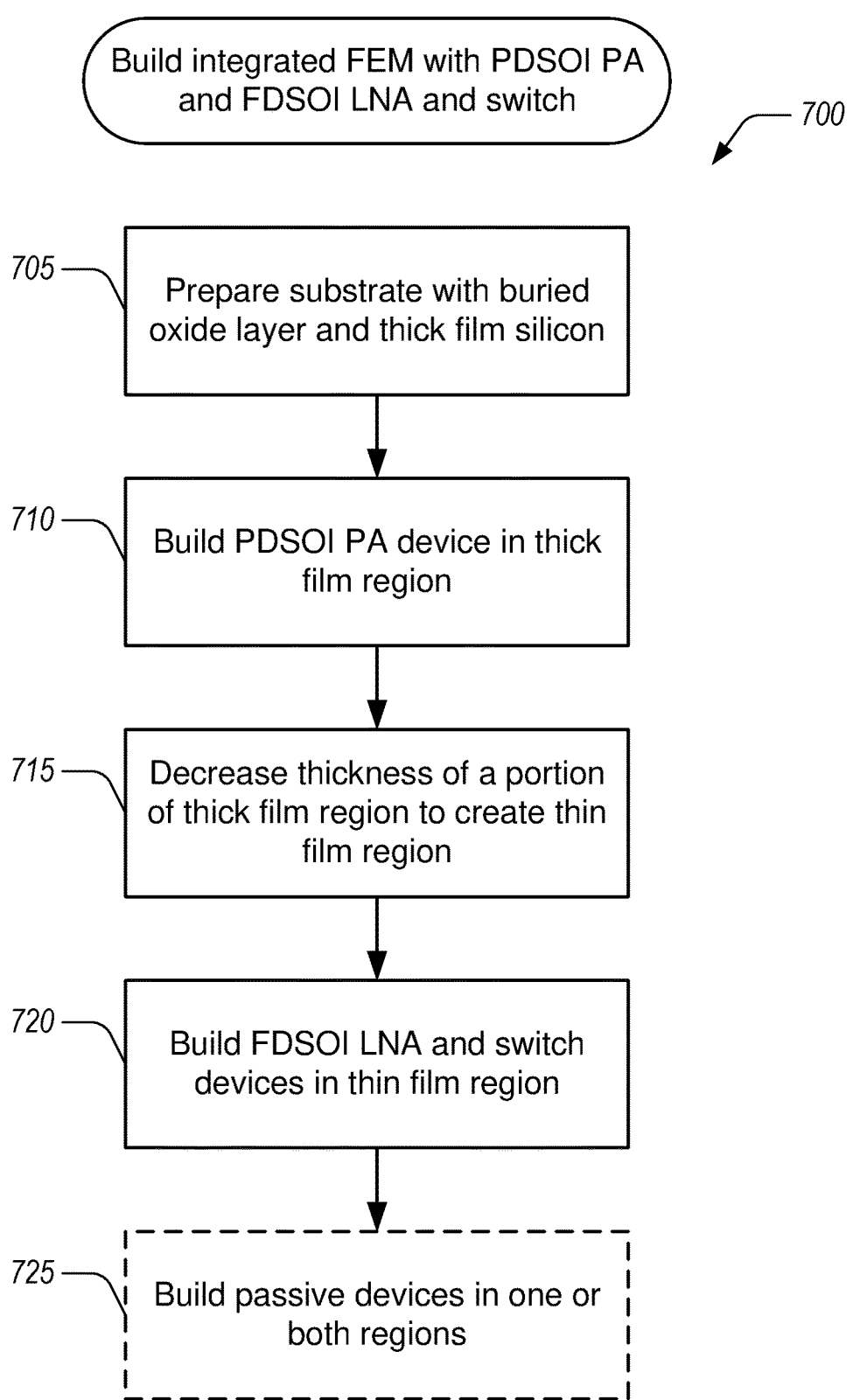
FIGS. 7A and 7B illustrate additional methods for building an integrated FEIC with a PDSOI PA device, a FDSOI LNA device, and a FDSOI switch device.

FIG. 7A illustrates a method 700 for building an integrated FEIC with a PDSOI PA device, a FDSOI LNA device, and a FDSOI switch device. FIGS. 4A-4D represent examples of a FEIC being manufactured corresponding to the steps of the method 500.

At block 505, a substrate with a buried oxide (BOX) layer and a thick film silicon layer is prepared. The substrate with the BOX layer and thick film silicon can be in the form of a silicon-on-insulator (SOI) wafer, for example. Preparation of the SOI wafer can occur in a separate process such that the step at block 505 includes receiving or providing the SOI wafer rather than requiring manufacturing of the SOI wafer. Preparation can also include any step performed to prepare the structure to enable building active devices in the thick film silicon layer. FIG. 4A represents an example of the FEIC at block 505.

The substrate can be a handle wafer. The BOX layer can be any suitable insulator, such as a thermal silicon oxide (SiO2). The thin film silicon layer can be a thin film deposited over the BOX, such as crystalline silicon. The thickness of the BOX layer can be anywhere between about 5 nm and about 400 nm, and may be at least about 100 nm and/or less than or equal to about 200 nm, sometimes referred to as a thick BOX layer as compared to a thin or ultra-thin BOX layer that is typically between about 5 nm and about 50 nm. The thickness of the thick film silicon layer can be between about 50 nm and about 180 nm. Any suitable process can be used to prepare the SOI wafer, including separation by implanted oxygen (SIMOX), bond and etch-back SOI (BESOI), epitaxial layer transfer (ELTRAN®), NANOCLEAVE®, SMART CUT™, etc.

At block 510, one or more PDSOI PA devices are built in the thick film silicon layer. The one or more PDSOI PA devices can be LDMOS and/or EDMOS PA devices. The thickness of the thick film silicon can be such that the channel is partially depleted when the active devices are in the ON state. FIG. 4B represents an example of the FEIC at block 510.

At block 515, the thickness of a region of the thin film silicon is decreased to create a thin film region that does not include any PDSOI active devices. Consequently, the region of the thick film silicon that is not subjected to the process to thin the silicon film layer can be referred to as a thick film region of the silicon layer, the thick film region including the one or more PDSOI PA devices. The thickness of the resulting thin film region can be between about 5 nm and about 50 nm thick or typically about ¼ of the gate length of an active device to be built in the thin film region. FIG. 4C represents an example of the FEIC at block 515.

Thinning of the thick film silicon layer can include any suitable process for local thinning. For example, thinning can include mechanical grinding, chemical mechanical planarization, wet etching, atmospheric downstream plasma dry chemical etching (ADP DCE), etc.

At bock 510, one or more FDSOI LNA devices and one or more FDSOI switch devices are built in the thin film region. These active devices can be built without doping the channel between their source and drain diffusions or the channel can be lightly doped. The thickness of the thin film region can be such that the channel is fully depleted when the active devices are in the ON state. FIG. 4D represents an example of the FEIC at block 520. Optionally at block 525, passive devices can be built in the thin film region, the thick film region, or both the thin film region and the thick film region.

The method 500 provides a number of advantages. For example, the associated parasitics are less with LDMOS PA devices and EDMOS PA devices on SOI as compared to implementations using bulk technologies. This leads to better or improved active device performance. As another example, the buried oxide layer can be a thick BOX layer (rather than an ultra-thin layer) to achieve desired performance characteristics. This results in more robust active device performance, higher power capabilities, and improved passive device performance. As another example, the resulting FEIC has the benefits of both FDSOI active devices (e.g., the switch devices and the LNA devices) as well as PDSOI active devices (e.g., the PA devices). In addition, the method 500 may be less expensive than the method 400 because thinning is typically a less expensive process than epitaxial growth or deposition.

Figure 7B:
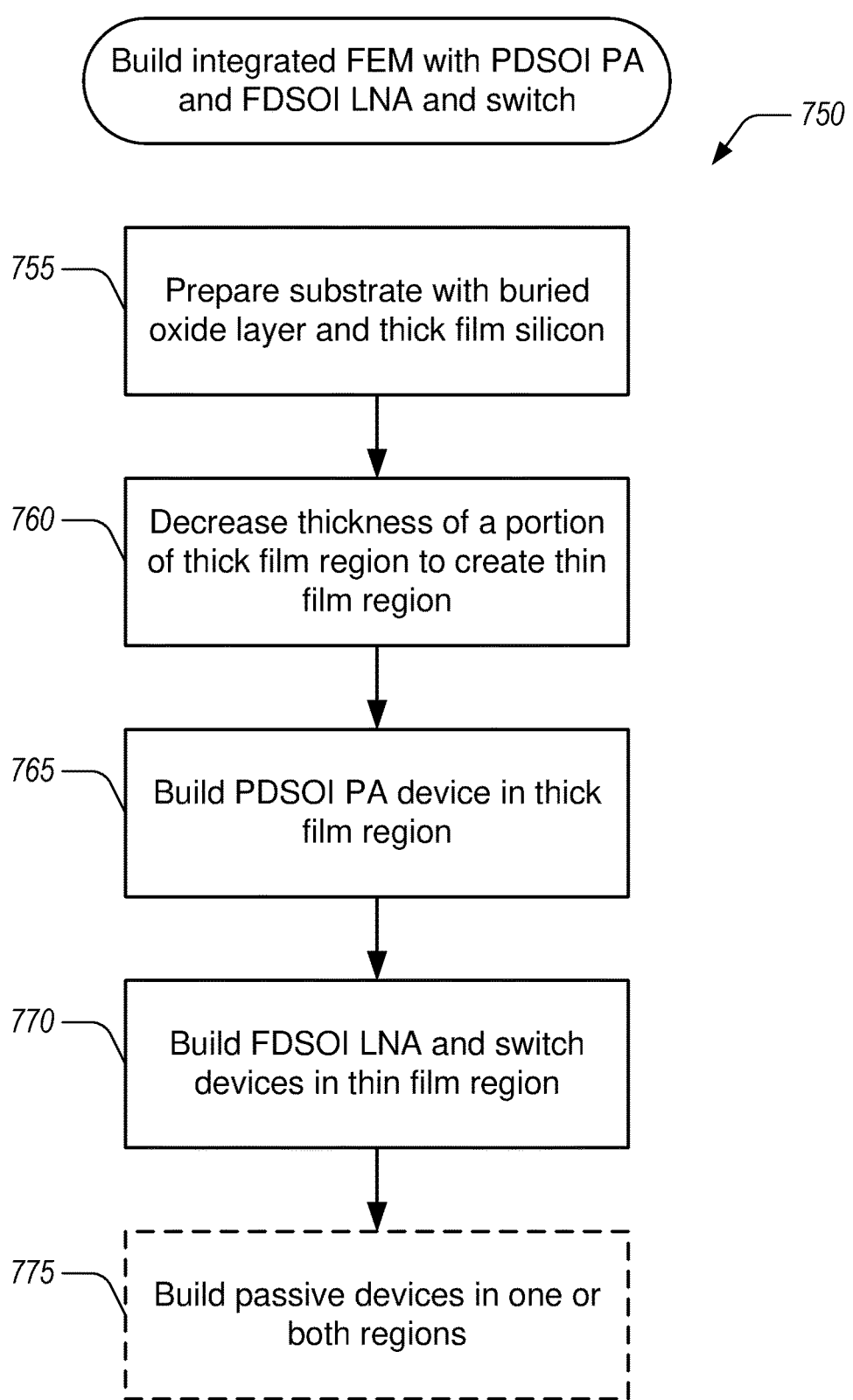

FIG. 7B illustrates a method 750 for building an integrated FEIC with a PDSOI PA device, a FDSOI LNA device, and a FDSOI switch device. FIGS. 5A-5D represent examples of a FEIC being manufactured corresponding to the steps of the method 750. It should be noted that the method 750 is substantially similar to the method 700 described with reference to FIG. 7A and thus shares the advantages of the method 700. A difference between the methods 700 and 750 is an order of the steps of the methods such that the method 750 prepares the substrate prior to building devices. In particular, the method 750 switches the order of building the devices in the thick film region and decreasing the thickness of a portion of the thick film region to create the thin film region. Accordingly, the description of the method 750 will be abbreviated, relying on the description of the method 700 to provide details for the method 750.

At block 755, a substrate with a BOX layer and a thick film silicon layer is prepared and may be in the form of a SOI wafer, for example. FIG. 5A represents an example of the FEIC at block 755.

At block 760, the thickness of a region of the thick film silicon is decreased to create a thin film region. Consequently, the region of the thick film silicon that is not subjected to the process to thin the silicon film layer can be referred to as a thick film region of the silicon layer. The thickness of the resulting thin film region can be between about 5 nm and about 50 nm. FIG. 5B represents an example of the FEIC at block 760.

At block 765, one or more PDSOI PA devices are built in the thick film region. The one or more PDSOI PA devices can be LDMOS and/or EDMOS PA devices. The thickness of the thick film silicon can be such that the channel is partially depleted when the active devices are in the ON state. At bock 770, one or more FDSOI LNA devices and one or more FDSOI switch devices are built in the thin film region of the silicon layer. These active devices can be built without doping the channel between their source and drain diffusions or the channel can be lightly doped. The thickness of the thin film silicon can be such that the channel is fully depleted when the active devices are in the ON state. Optionally at block 775, passive devices can be built in the thin film region, the thick film region, or both the thin film region and the thick film region.

FIGS. 5C and 5D represent examples of the FEIC at blocks 765 and 770. It should be understood that although the blocks 765 and 770 indicate that devices are built in the thick film region and then built in the thin film region, other implementations of the method 750 include partially building devices in both the thin film region and the thick film region (e.g., as illustrated in FIG. 5C) and then completing the devices in both regions (e.g., as illustrated in FIG. 5D). In some implementations, shared masks may be used to complete the devices, as described herein. This may also apply to the method 600 where devices are partially built in the thin film region and the thick film region and then completed at a separate step with shared masks potentially being used in some instances.

In addition, it should be understood that the methods 600, 650, 700, 750 can be used to prepare the FEIC 100*b* illustrated in FIG. 1B. The modification to the methods 600, 650, 700, 750 would be to exchange the steps for preparing specific PDSOI PA devices, FDSOI LNA devices, and/or FDSOI switches with other circuitry described with respect to FIG. 1B.

ADDITIONAL EMBODIMENTS AND TERMINOLOGY

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged, and certain steps and/or phases may be omitted entirely. Also, the methods described herein are to be understood to be open-ended, such that additional steps and/or phases to those shown and described herein can also be performed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end integrated circuit comprising:
   a substrate;
   an insulator layer on top of the substrate; and
   a semiconductor layer on top of the insulator layer, the semiconductor layer forming a thin film region and a thick film region, the thin film region including one or more fully depleted silicon-on-insulator (FDSOI) low noise amplifier (LNA) devices and one or more FDSOI switch devices, the thick film region including one or more partially depleted silicon-on-insulator (PDSOI) power amplifier (PA) devices, the semiconductor layer in the thin film region being at least 5 nm thick and less than or equal to 50 nm thick and the semiconductor layer in the thick film region being at least about 50 nm thick and less than or equal to 180 nm thick.

2. The front end integrated circuit of claim 1 wherein the insulator layer is at least 100 nm thick.

3. The front end integrated circuit of claim 1 wherein the insulator layer is a buried oxide layer.

4. The front end integrated circuit of claim 1 wherein the semiconductor layer in the thin film region is ¼ of a gate length of the one or more FDSOILNA devices.

5. The front end integrated circuit of claim 1 wherein the thin film region of the semiconductor layer is formed using local thinning.

6. The front end integrated circuit of claim 1 wherein the thick film region of the semiconductor layer is formed using selective epitaxial growth.

* * * * *